United States Patent
Jao et al.

(10) Patent No.: US 12,300,727 B2
(45) Date of Patent: May 13, 2025

(54) PROCESS AND STRUCTURE FOR SOURCE/DRAIN CONTACTS

(71) Applicant: Taiwan Semiconductor Manufacturing Company, Ltd., Hsinchu (TW)

(72) Inventors: Meng-Huan Jao, Hsinchu (TW); Lin-Yu Huang, Hsinchu (TW); Sheng-Tsung Wang, Hsinchu (TW); Huan-Chieh Su, Changhua County (TW); Cheng-Chi Chuang, New Taipei (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,262

(22) Filed: Jul. 28, 2023

(65) Prior Publication Data

US 2023/0387220 A1 Nov. 30, 2023

Related U.S. Application Data

(62) Division of application No. 17/338,384, filed on Jun. 3, 2021, now Pat. No. 11,784,228.
(Continued)

(51) Int. Cl.
*H01L 29/00* (2006.01)
*H01L 21/311* (2006.01)
(Continued)

(52) U.S. Cl.
CPC ...... *H01L 29/401* (2013.01); *H01L 21/31138* (2013.01); *H01L 21/31144* (2013.01);
(Continued)

(58) Field of Classification Search
CPC ......... H01L 29/41725; H01L 29/41733; H01L 29/41766; H01L 29/0665; H01L 29/0669;
(Continued)

(56) References Cited

U.S. PATENT DOCUMENTS

| 8,772,109 B2 | 7/2014 | Colinge |
| 8,785,285 B2 | 7/2014 | Tsai |

(Continued)

FOREIGN PATENT DOCUMENTS

| CN | 106505104 A | 3/2017 |
| DE | 112015006959 T5 | 6/2018 |

(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript# JVSTA-A-14-332.

(Continued)

*Primary Examiner* — Reema Patel
(74) *Attorney, Agent, or Firm* — Haynes and Boone, LLP

(57) ABSTRACT

A method includes providing a structure having source/drain electrodes and a first dielectric layer over the source/drain electrodes; forming a first etch mask covering a first area of the first dielectric layer; performing a first etching process to the first dielectric layer, resulting in first trenches over the source/drain electrodes; filling the first trenches with a second dielectric layer that has a different material than the first dielectric layer; removing the first etch mask; performing a second etching process including isotropic etching to the first area of the first dielectric layer, resulting in a second trench above a first one of the source/drain electrodes; depositing a metal layer into at least the second trench; and
(Continued)

performing a chemical mechanical planarization (CMP) process to the metal layer.

20 Claims, 32 Drawing Sheets

Related U.S. Application Data

(60) Provisional application No. 63/173,108, filed on Apr. 9, 2021.

(51) Int. Cl.
*H01L 21/321* (2006.01)
*H01L 29/40* (2006.01)
*H01L 29/417* (2006.01)
*H01L 29/45* (2006.01)

(52) U.S. Cl.
CPC .... *H01L 21/3212* (2013.01); *H01L 29/41725* (2013.01); *H01L 29/45* (2013.01)

(58) Field of Classification Search
CPC ........... H01L 29/0673; H01L 29/42376; H01L 29/4236; H01L 29/42392
See application file for complete search history.

(56) References Cited

U.S. PATENT DOCUMENTS

| | | | |
|---|---|---|---|
| 8,802,504 B1 | 8/2014 | Hou | |
| 8,803,292 B2 | 8/2014 | Chen | |
| 8,803,316 B2 | 8/2014 | Lin | |
| 8,816,444 B2 | 8/2014 | Wann | |
| 8,823,065 B2 | 9/2014 | Wang | |
| 8,836,016 B2 | 9/2014 | Wu | |
| 8,841,701 B2 | 9/2014 | Lin | |
| 8,847,293 B2 | 9/2014 | Lee | |
| 8,853,025 B2 | 10/2014 | Zhang | |
| 8,860,148 B2 | 10/2014 | Hu | |
| 8,962,400 B2 | 2/2015 | Tsai | |
| 8,993,380 B2 | 3/2015 | Hou | |
| 9,093,514 B2 | 7/2015 | Tsai | |
| 9,105,490 B2 | 8/2015 | Wang | |
| 9,236,267 B2 | 1/2016 | De | |
| 9,236,300 B2 | 1/2016 | Liaw | |
| 9,245,805 B2 | 1/2016 | Yeh | |
| 9,257,439 B2 | 2/2016 | Liaw | |
| 9,281,254 B2 | 3/2016 | Yu | |
| 9,299,649 B2 | 3/2016 | Chiu | |
| 9,372,206 B2 | 6/2016 | Wu | |
| 9,425,126 B2 | 8/2016 | Kuo | |
| 9,443,783 B2 | 9/2016 | Lin | |
| 9,496,189 B2 | 11/2016 | Yu | |
| 9,520,482 B1 | 12/2016 | Chang | |
| 9,576,814 B2 | 2/2017 | Wu | |
| 9,704,835 B2 | 7/2017 | Fong | |
| 9,711,555 B2 | 7/2017 | Liu | |
| 9,818,872 B2 | 11/2017 | Ching | |
| 9,887,269 B2 | 2/2018 | Ching | |
| 9,899,398 B1 | 2/2018 | Colinge | |
| 10,020,261 B2 | 7/2018 | Wu | |
| 10,032,627 B2 | 7/2018 | Lee | |
| 10,109,721 B2 | 10/2018 | Lin | |
| 10,157,799 B2 | 12/2018 | Ching | |
| 10,199,502 B2 | 2/2019 | Huang | |
| 10,269,715 B2 | 4/2019 | Wu | |
| 10,282,504 B2 | 5/2019 | Wu | |
| 10,319,581 B1 | 6/2019 | Wen | |
| 10,483,378 B2 | 11/2019 | Ching | |
| 10,490,552 B2 | 11/2019 | Lee | |
| 10,522,642 B2 | 12/2019 | Lee | |
| 11,201,106 B2 | 12/2021 | Chen | |
| 11,233,005 B1 | 1/2022 | Chen | |
| 11,302,798 B2 | 4/2022 | Chuang | |
| 11,316,023 B2 | 4/2022 | Huang | |
| 11,342,413 B2 | 5/2022 | Huang | |
| 11,387,346 B2 | 7/2022 | Huang | |
| 11,404,570 B2 | 8/2022 | Chang | |
| 11,443,987 B2 | 9/2022 | Chen | |
| 11,515,211 B2 | 11/2022 | Chu | |
| 11,715,781 B2 | 8/2023 | Huang | |
| 2014/0332749 A1 | 11/2014 | Yokoyama | |
| 2015/0200269 A1* | 7/2015 | Yin | H01L 29/6659 438/294 |
| 2016/0049516 A1 | 2/2016 | Huang | |
| 2016/0104793 A1 | 4/2016 | Ching | |
| 2016/0118462 A1* | 4/2016 | Tseng | H01L 27/0886 257/386 |
| 2016/0233298 A1 | 8/2016 | Webb | |
| 2016/0268434 A1 | 9/2016 | Ching | |
| 2017/0012042 A1 | 1/2017 | Cai | |
| 2017/0178960 A1 | 6/2017 | Basker | |
| 2017/0207126 A1 | 7/2017 | Ching | |
| 2018/0005876 A1 | 1/2018 | Tung | |
| 2018/0175036 A1 | 6/2018 | Ching | |
| 2019/0006486 A1 | 1/2019 | Ching | |
| 2021/0273062 A1 | 9/2021 | Huang | |
| 2021/0391325 A1 | 12/2021 | Su | |
| 2022/0344496 A1 | 10/2022 | Su | |

FOREIGN PATENT DOCUMENTS

| | | |
|---|---|---|
| DE | 102020103515 A1 | 9/2020 |
| TW | 201725615 A | 7/2017 |

OTHER PUBLICATIONS

Michallet, Jean-Eric, et al. "CoolCube: A True 3DVLSI Alternative to Scaling", Mar. 24, 2015, 3DInCities. rittps://www.3dincities.com/2015/03/coolcube-a-true-3dvlsi-alternative-to-scaling/.

* cited by examiner

PROCESS AND STRUCTURE FOR SOURCE/DRAIN CONTACTS

PRIORITY

This application is a divisional of U.S. patent application Ser. No. 17/338,384, filed Jun. 3, 2021, which claims the benefits of and priority to U.S. Provisional Application No. 63/173,108, filed Apr. 9, 2021, the disclosures of which are herein incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when the scaling down continues beyond 32 nm or smaller, isolation among nearby S/D contacts becomes a concern. Poor isolation may lead to TDDB (time dependent dielectric breakdown) failure. Methods and structures for increasing isolation among nearby S/D contacts are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
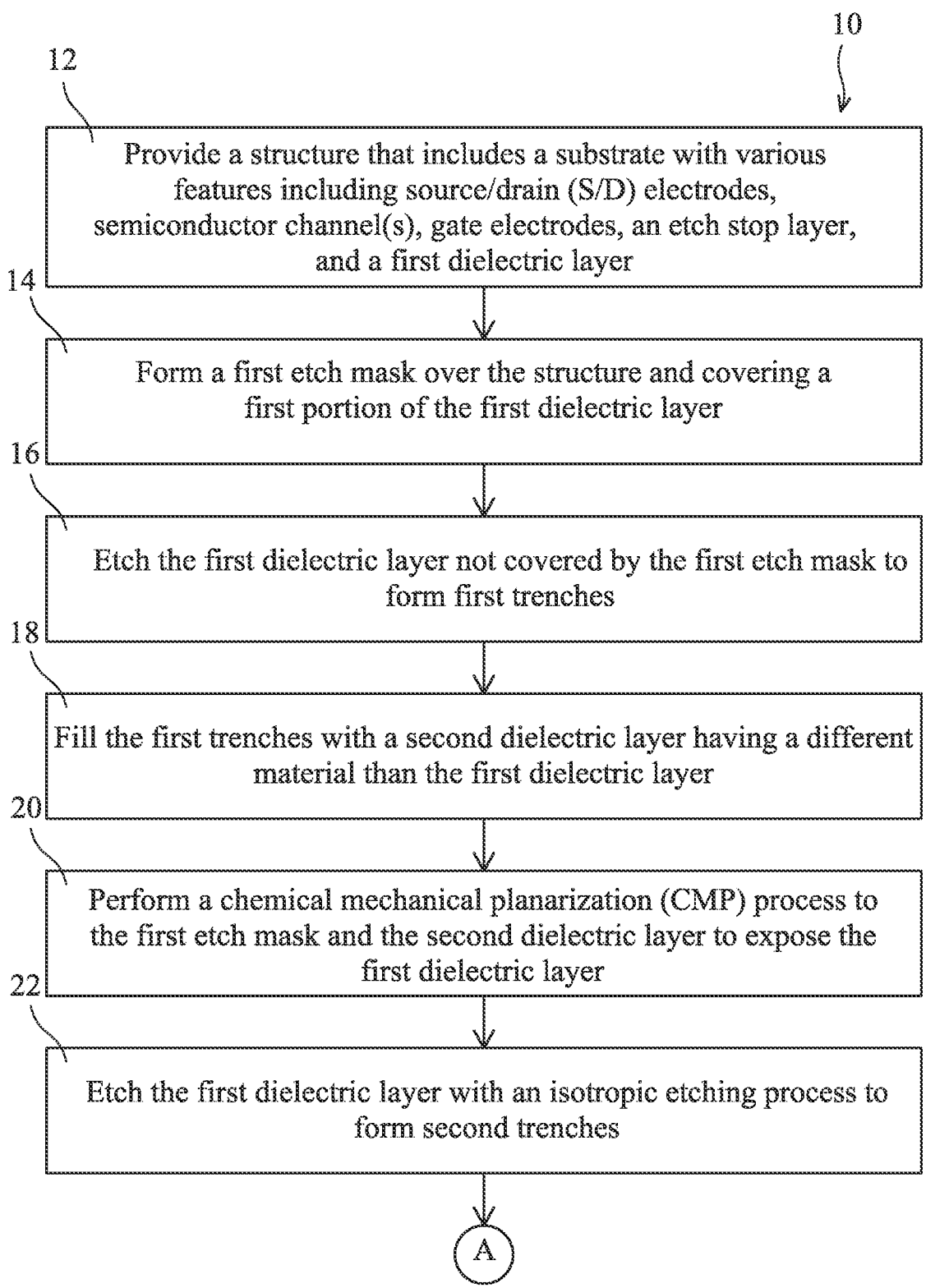
FIGS. 1A and 1B show a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to a semiconductor device and its manufacturing method, and more particularly to source/drain (S/D) contacts and formation methods thereof. Source/drain contacts refer to metallic contacts or metal compounds that land on source electrodes and/or drain electrodes of transistors. They are also referred to as MDs in some instances. Forming S/D contacts generally includes a variety of processes. One of the processes is to etch a dielectric layer over the S/D electrodes so that the S/D electrodes can be exposed for making the connection to the S/D contacts. The etching of the dielectric layer may be anisotropic or isotropic. When anisotropic etching (such as by plasma bombardment) is used, it generally causes some losses in a dielectric protection layer (called SAC layer) on top of metal gates (MG). As a result, the SAC layer becomes rounded or tapered. After depositing metals for S/D contacts, this rounded SAC layer will lead to reduced lateral distance between adjacent S/D contacts and may cause TDDB failure. An object of the present disclosure is to solve the above problem by using a process that includes isotropic etching of the dielectric layer over the S/D electrodes. Further, when etching the dielectric layer by an isotropic etching process, isolated areas (where transistors are sparsely distributed) and dense areas (where transistors are densely distributed) on the same IC may be processed separately to achieve good control of the etching profile in both areas.

The disclosed methods and structures can be applied to ICs having FinFETs, gate-all-around (GAA) transistors, or other types of transistors. GAA transistors refer to transistors having gate stacks (which include gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein. The various aspects of the present disclosure will be further discussed with reference to FIGS. 1A-17.

Figure 1B:
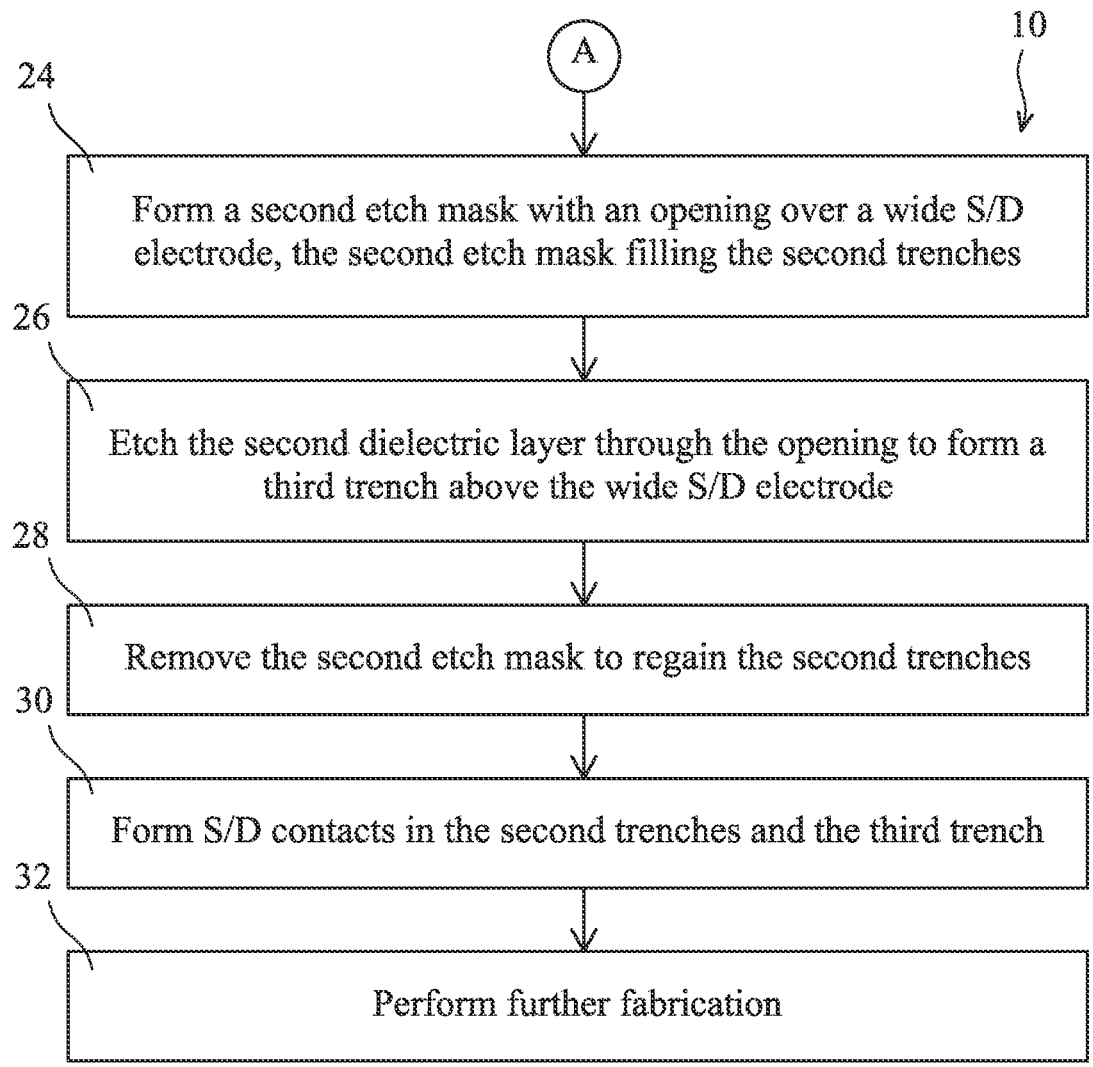

FIGS. 1A and 1B show a flow chart of a method 10 of forming a semiconductor device 200 (or a semiconductor structure 200), according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 2A-17 which illustrate portions of the semiconductor device 200 in various stages of a manufacturing process. Particularly, FIGS. 2A, 3A, 4A, 5A, 6A, 7A, 8A, 9A, 10A, 11A, 12A, 13A, 14A, and 15A are top views of a portion of the semiconductor device 200; and FIGS. 2B, 3B, 4B, 5B, 6B, 7B, 8B, 9B, 10B, 11B, 12B, 13B, 14B, 15B, 16, and 17 are cross-sectional views of the portion of the semiconductor device 200 along the "B-B" line of FIGS. 2A through 15A. The "B-B" line is along a channel length (or gate length, Lg) direction. The semiconductor device 200 is provided for illustration purposes and does not necessarily limit the embodiments of the present disclosure to any number of devices, any number of regions, or any configuration of structures or regions. Furthermore, the semiconductor device 200 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs and gate-all-around devices, metal-oxide semiconductor field effect transistors (MOSFETs), complementary metal-oxide semiconductor (CMOS) transistors, bipolar transistors, high voltage transistors, high frequency transistors, other memory cells, and combinations thereof. The semiconductor device 200 is shown in FIGS. 2A through 17 as having GAA transistors. In alternative embodiments, the semiconductor device 200 may have FinFET or other types of transistors. FIGS. 2A through 17 have been simplified for the sake of clarity to better understand the inventive concepts of the present disclosure. Additional features can be added in the semiconductor device 200, and some of the features described below can be replaced, modified, or eliminated in other embodiments of the semiconductor device 200.

Figure 2A:
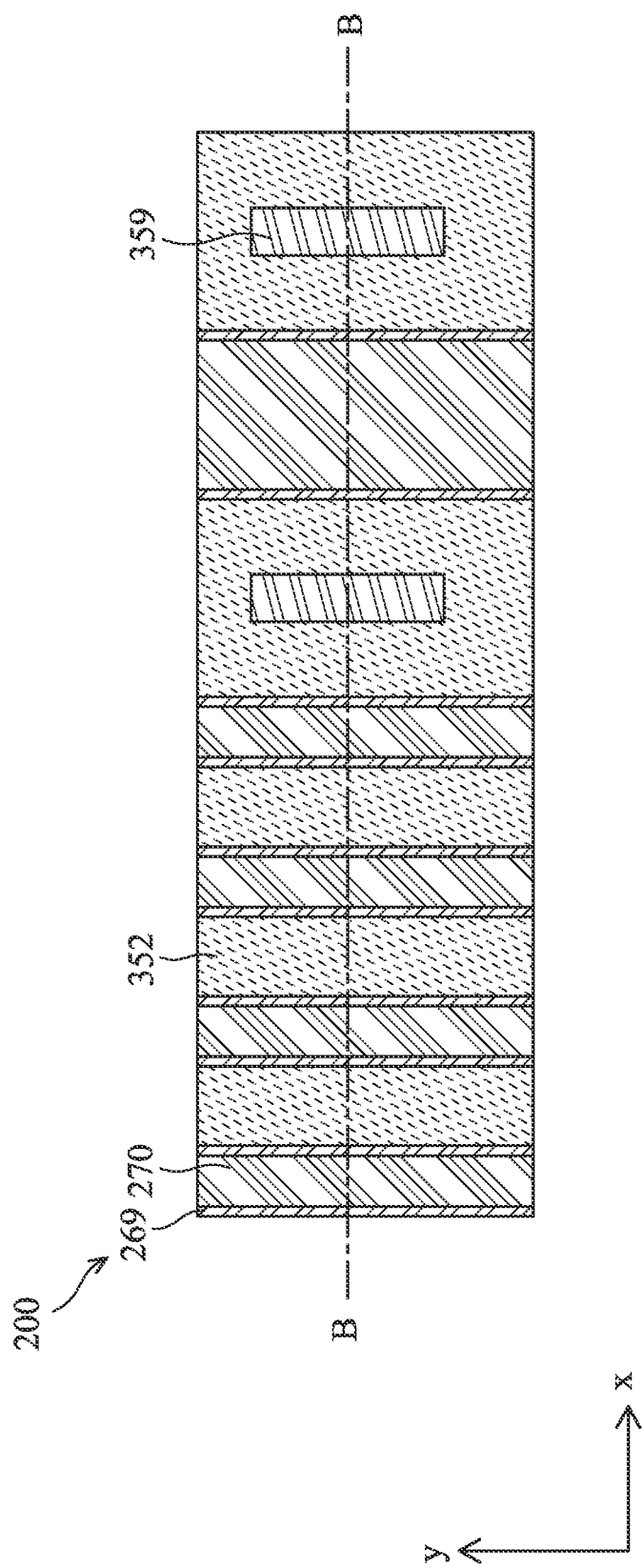
FIGS. 2A, 3A, 4A, 5A, 6A, 7A, 8A, 9A, 10A, 11A, 12A, 13A, 14A, and 15A are top views of a portion of a semiconductor device during various manufacturing stages according to the method in FIGS. 1A and 1B in accordance with embodiments of the present disclosure.
Figure 2B:
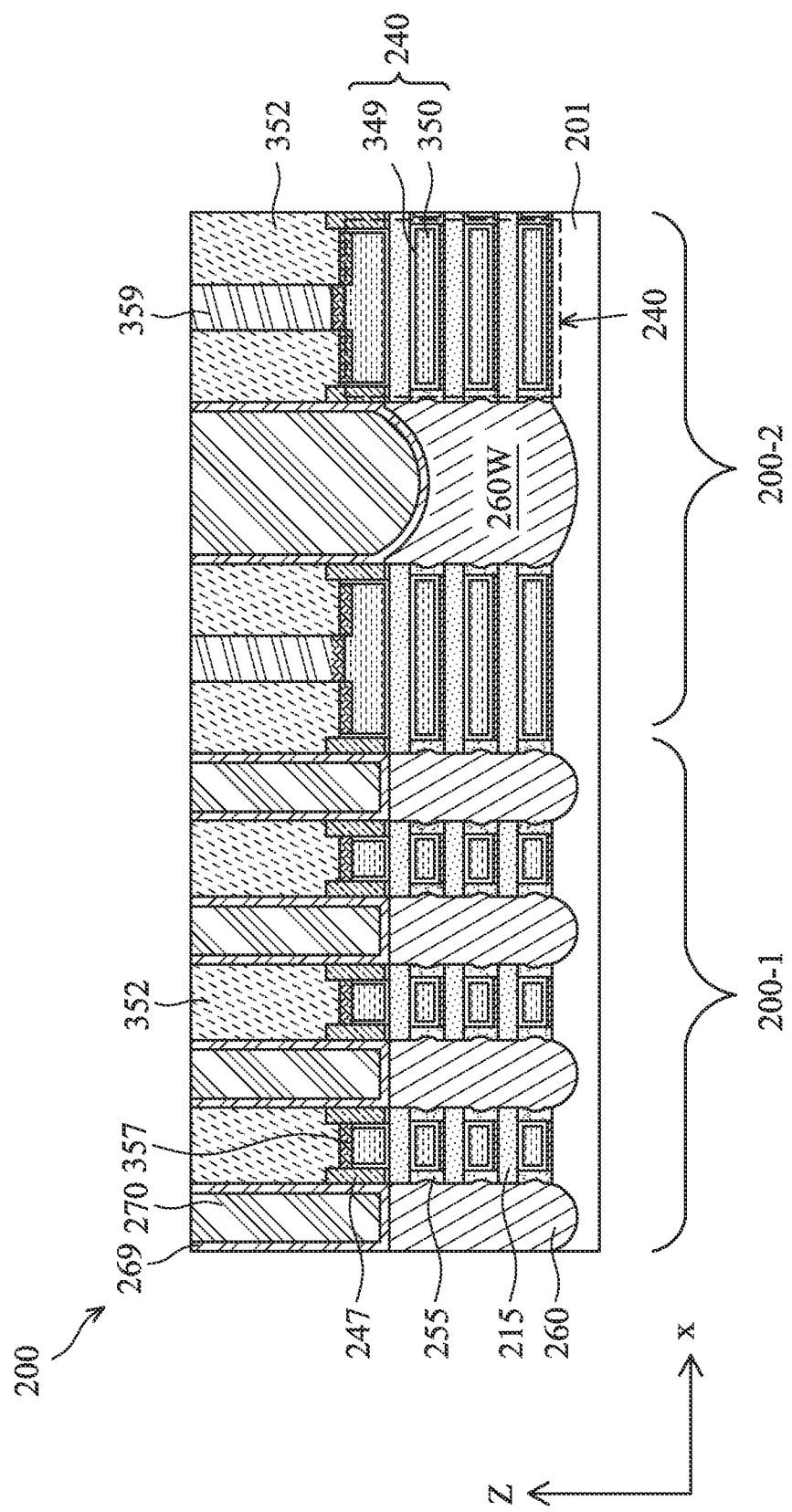
FIGS. 2B, 3B, 4B, 5B, 6B, 7B, 8B, 9B, 10B, 11B, 12B, 13B, 14B, and 15B are cross-sectional views of a portion of the semiconductor device along the B-B line of FIGS. 2A through 15A, respectively, during various manufacturing stages according to the method in FIGS. 1A and 1B in accordance with embodiments of the present disclosure.

At operation 12, the method 10 (FIG. 1A) provides an intermediate structure of the semiconductor device 200, an embodiment of which is shown in FIGS. 2A and 2B. Referring to FIGS. 2A and 2B, the semiconductor device 200 includes a substrate 201 and various features built in or on the substrate 201. In the depicted embodiment, the semiconductor device 200 includes S/D electrodes 260 over S/D regions of the substrate 201. In an embodiment, the substrate 201 includes various semiconductor fins protruding from a base substrate, and the S/D electrodes 260 are disposed over the semiconductor fins. In that regard, the portion of the substrate 201 shown in FIG. 2B is part of a semiconductor fin and the "x" direction is the lengthwise direction of the semiconductor fin. Even though not shown, the semiconductor device 200 includes isolation structures (such as shallow trench isolation (STI)) to isolate active regions such as semiconductor fins.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

The S/D electrodes 260 include epitaxially grown semiconductor materials such as epitaxially grown silicon, germanium, or silicon germanium. The S/D electrodes 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D electrodes 260 may be doped with n-type dopants and/or p-type dopants. In some embodiments, for n-type transistors, the S/D electrodes 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D electrodes 260 include silicon germanium or germanium, and can be doped with boron, other p-type dopant, or combinations thereof (for example, forming Si:Ge:B epitaxial S/D features). The S/D electrodes 260 may include multiple epitaxial semiconductor layers having different levels of dopant density. In some embodiments, annealing processes (e.g., rapid thermal annealing (RTA) and/or laser annealing) are performed to activate dopants in the epitaxial S/D electrodes 260.

Still referring to FIGS. 2A and 2B, the semiconductor device 200 further includes one or more channel layers 215 suspended over the substrate 201 and connecting the S/D electrodes 260 along the "x" direction, gate stacks 240 between the S/D electrodes 260 and wrapping around each of the channel layers 215, inner spacers 255 between the S/D electrodes 260 and the gate stacks 240, and gate spacers (or outer gate spacers) 247 over sidewalls of the gate stacks 240 and over the topmost channel layers 215. Over the gate stacks 240, the semiconductor device 200 further includes a self-aligned capping (SAC) layer 352. In some implementations (like depicted in FIG. 2B), a glue layer 357 may be deposited directly on the gate stacks 240 and to improve adhesion between the gate stacks 240 and the layers above. In an embodiment where the semiconductor device 200 is a FinFET device, the channel layers 215 are merged into one channel layer (a semiconductor fin channel), and the inner spacers 255 are omitted. Further, in such FinFET embodiment, the gate stacks 240 each engages top and sidewalls of the semiconductor fin channel, and in the cross-sectional view of FIG. 2B, the gate stack 240 would be on top of the semiconductor fin channel only.

In some embodiments, the channel layers 215 include a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are part of an initial stack of semiconductor layers that include the channel layers 215 and other (sacrificial) semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stacks 240, the sacrificial semiconductor layers are removed, leaving the channel layers 215 suspended over the substrate 201. In some embodiments, the semiconductor device 200 may include 3 to 8 channel layers 215 per transistor, for example.

In some embodiments, the inner spacers 255 include a low-k dielectric material (for example, k<7) that includes silicon, oxygen, carbon, nitrogen, other suitable material, or combinations thereof (for example, silicon oxide, silicon nitride, silicon oxynitride, silicon carbide, or silicon oxycarbonitride). The inner spacers 255 may be formed by deposition and etching processes. For example, after S/D trenches are etched and before the S/D electrodes 260 are epitaxially grown from the S/D trenches, an etching process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacers 255.

In the depicted embodiment, each gate stack 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, each gate stack 240 further includes an interfacial layer between the gate dielectric layer 349 and the channel layers 215. The interfacial layer may include silicon dioxide, silicon oxynitride, or other suitable materials. In some embodiments, the gate electrode 350 includes an n-type or a p-type work function metal layer and a metal fill layer. For example, an n-type work function metal layer may comprise a metal with sufficiently low effective work function such as titanium, aluminum, tantalum carbide, tantalum carbide nitride, tantalum silicon nitride, or combinations thereof. For example, a p-type work function metal layer may comprise a metal with a sufficiently large effective work function, such as titanium nitride, tantalum nitride, ruthenium, molybdenum, tungsten, platinum, or combinations thereof. For example, the metal fill layer may include aluminum, tungsten, cobalt, copper, and/or other suitable materials. The gate electrode 350 may be formed by CVD, PVD, plating, and/or other suitable processes. Since the gate stacks 240 include a high-k dielectric layer and metal layer(s), they are also referred to as high-k metal gates.

In some embodiments, the gate spacers 247 include a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacers 247 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacers 247 may have a thickness of about 1 nm to about 40 nm, for example.

In some embodiments, the glue layer 357 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD.

In some embodiments, the SAC layer 352 includes $Si_3N_4$, SiCN, SiC, SiOC, SiOCN, $HfO_2$, $ZrO_2$, $ZrAlO_x$, $HfAlO_x$, $HfSiO_x$, $Al_2O_3$, or other suitable material(s). The SAC layer 352 protects the gate stacks 240 from etching and CMP processes that are used for etching S/D contact holes, which will be discussed. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials. In some embodiments, the SAC layer 352 may have a thickness of 0 nm (not existent) to about 50 nm.

In the depicted embodiment, the semiconductor device 200 further includes a contact etch stop layer (CESL) 269 adjacent to the gate spacers 247 and over the S/D electrodes 260, and an inter-layer dielectric (ILD) layer 270 over the CESL 269. In embodiments, the CESL 269 may include $Si_3N_4$, SiCN, SiC, SiOC, SiOCN, $HfO_2$, $ZrO_2$, $ZrAlO_x$, $HfAlO_x$, $HfSiO_x$, $Al_2O_3$, or other suitable material(s); and may be formed by CVD, PVD, ALD, or other suitable methods. The ILD layer 270 may comprise tetraethylorthosilicate (TEOS) formed oxide (e.g., reacting TEOS with oxygen using CVD to deposit silicon oxide), un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 270 may each be formed by PECVD (plasma enhanced CVD), FCVD (flowable CVD), or other suitable methods.

Still referring to FIGS. 2A and 2B, the semiconductor device 200 further includes gate vias 359 disposed on the gate electrode 350 or disposed on the glue layer 357 if present. The gate vias 359 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the gate vias 359.

Further as shown in FIG. 2B, the semiconductor device 200 includes different regions including region 200-1 and 200-2. For example, transistors in the region 200-1 are more densely arranged than the transistors in the region 200-2. In that regard, the region 200-1 may be referred to as a dense region, and the region 200-2 may be referred to as an isolated region (or a sparse region). In the present embodiment, transistors in the region 200-2 are larger than the transistors in the region 200-1. For example, the S/D electrodes 260 in the region 200-2 are wider (along the "x" direction) than the S/D electrodes 260 in the region 200-1. For convenience, the S/D electrodes 260 in the region 200-2 are labeled as 260w. Further, the channel layers 215 in the region 200-2 are longer (along the "x" direction) than the channel layers 215 in the region 200-1; and the gate stacks 240 in the region 200-2 are longer (along the "x" direction) than the gate stacks 240 in the region 200-1. In other words, the transistors in the region 200-2 have a larger gate length than the transistors in the region 200-1. Because the transistors have different sizes in the two regions 200-1 and 200-2, some process steps are performed differently or separately for the two regions, as will be discussed.

Figure 3A:
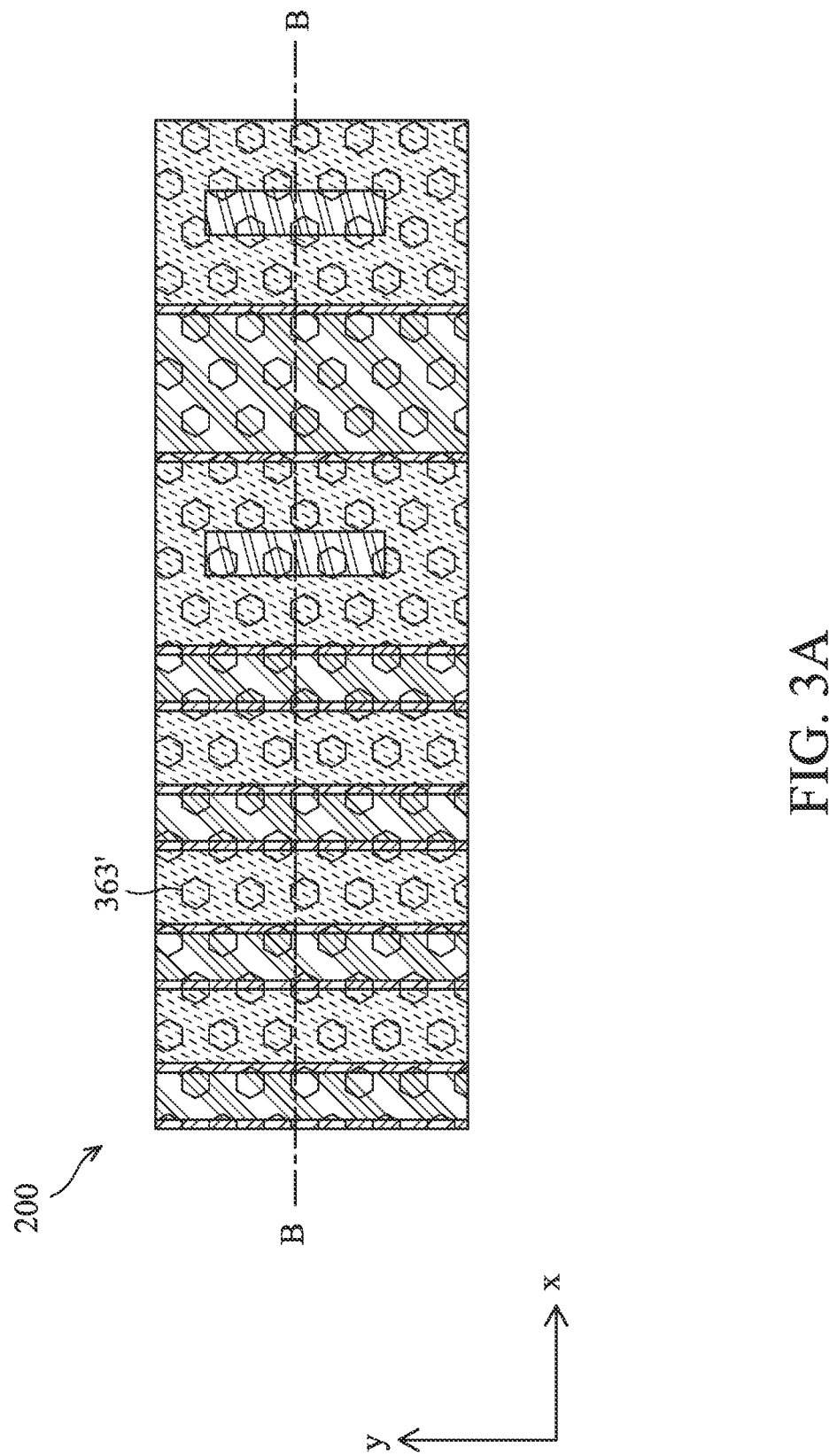
Figure 3B:
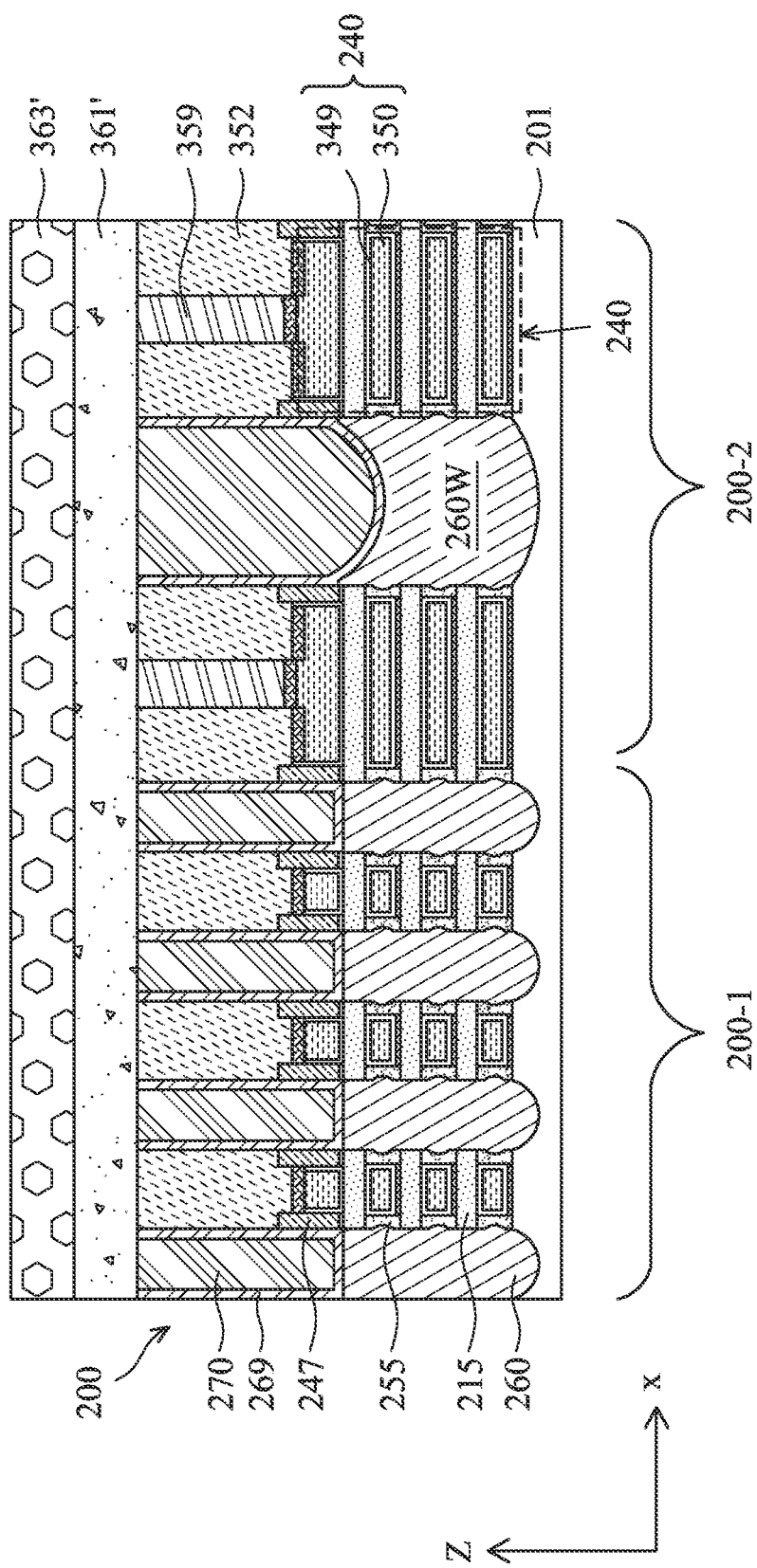
Figure 4A:
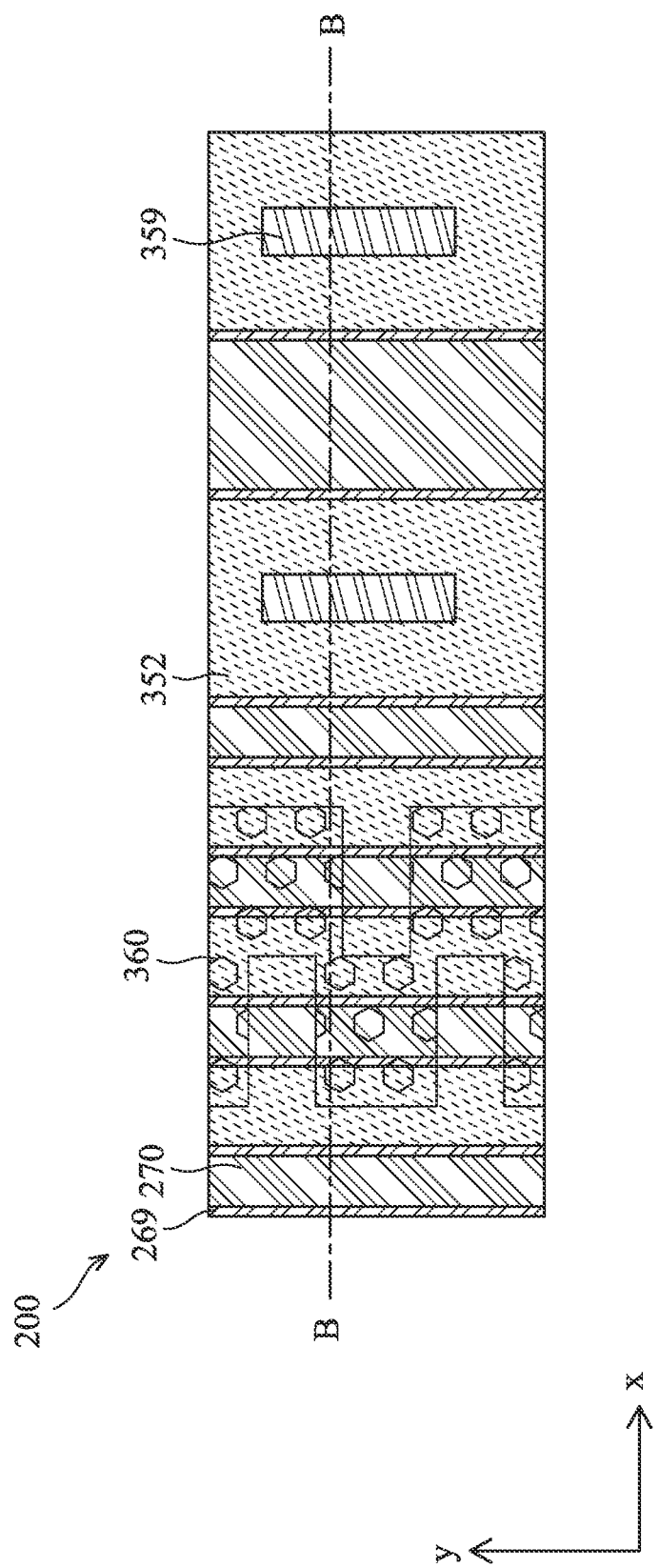
Figure 4B:
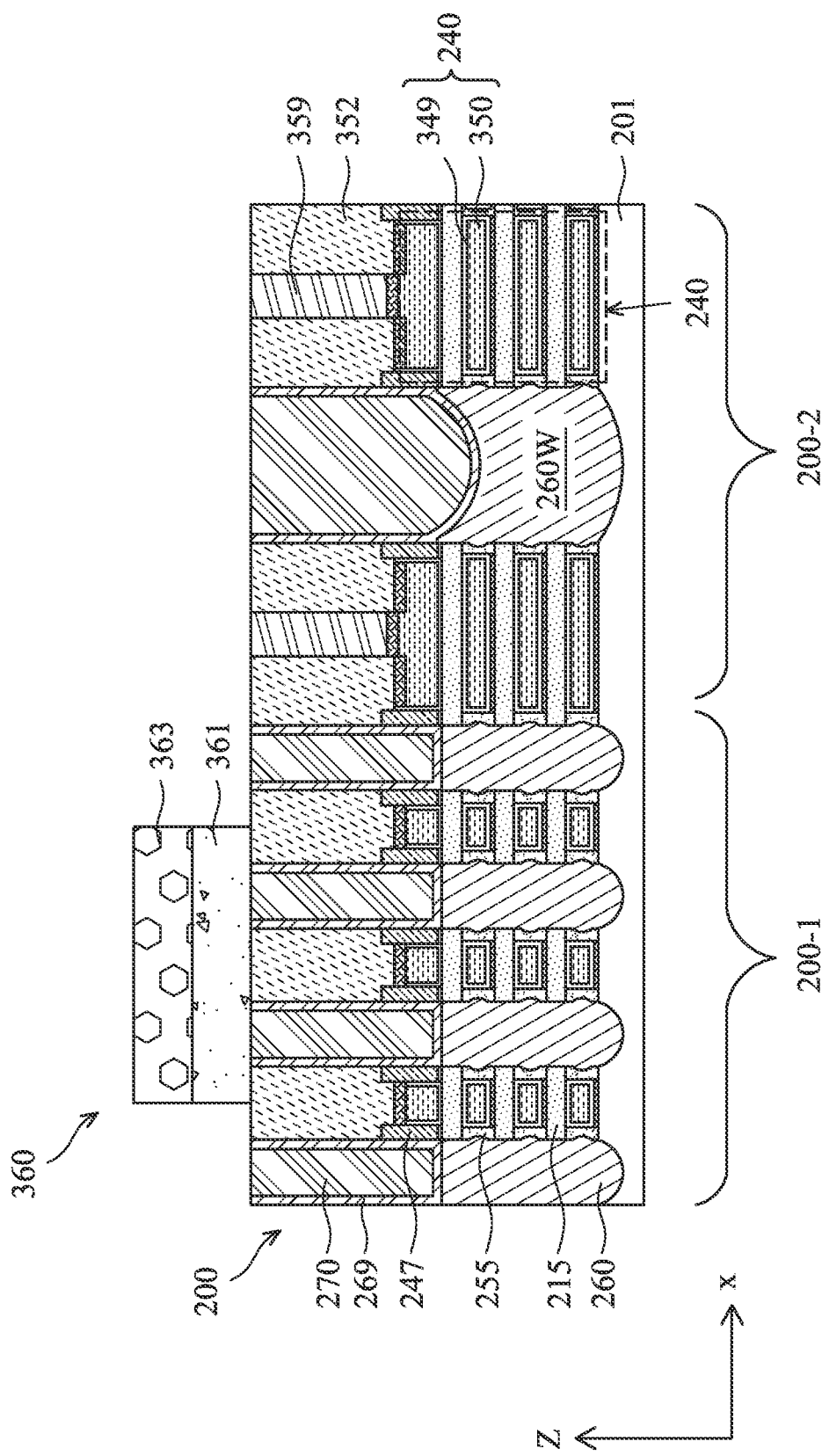

At operation 14, the method 10 (FIG. 1A) forms an etch mask 360 over some of the source/drain electrodes 260 in the region 200-1, such as shown in FIGS. 4A and 4B. The etch mask 360 covers a portion of the ILD layer 270 which will be etched to form contact holes that expose the underlying source/drain electrodes 260 in the region 200-1. The etch mask 360 includes a resist pattern 363 over a patterned hard mask 361. Operation 14 includes a variety of processes including deposition, photolithography, and etching processes. For example, as shown in FIGS. 3A and 3B, a hard mask layer 361' is deposited (for example, by CVD) over the semiconductor device 200 and a photoresist layer 363' is formed (for example, by spin-coating) over the hard mask layer 361'. The hard mask layer 361' may include silicon nitride or other suitable material. In some embodiments, an anti-reflective coating (ARC) layer or other layer(s) may be deposited between the photoresist layer 363' and the hard mask layer 361'. Then, operation 14 performs a photolithography process that includes exposing the photoresist layer 363' to radiation energy (e.g., UV light, DUV light, or EUV light) and developing the exposed photoresist layer 363' in a developing solution. After development, the photoresist layer 363' is patterned into the resist pattern 363 such as shown in FIGS. 4A and 4B. The hard mask layer 361' is then etched through the resist pattern 363 to result in the patterned hard mask 361. In the present embodiment, the etch mask 360 covers portions of the region 200-1 and does not cover the region 200-2.

Figure 5A:
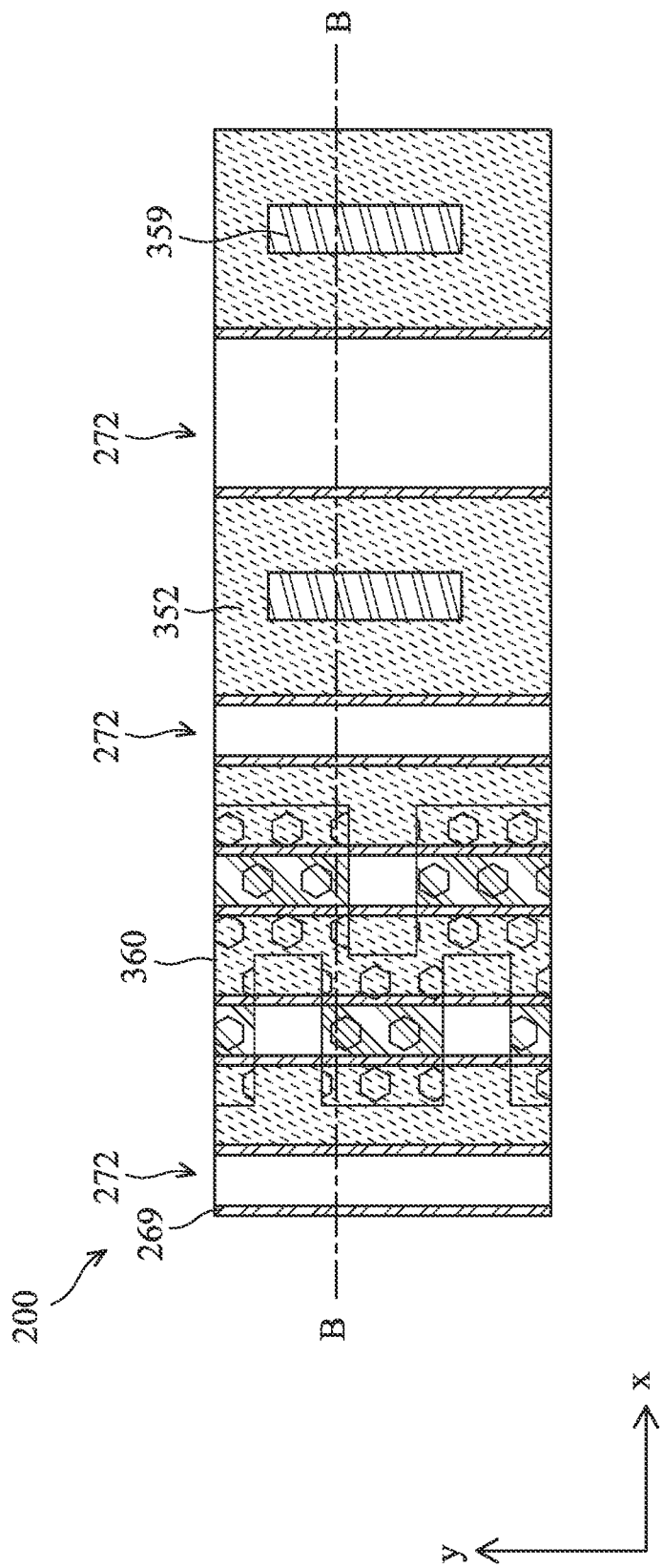
Figure 5B:
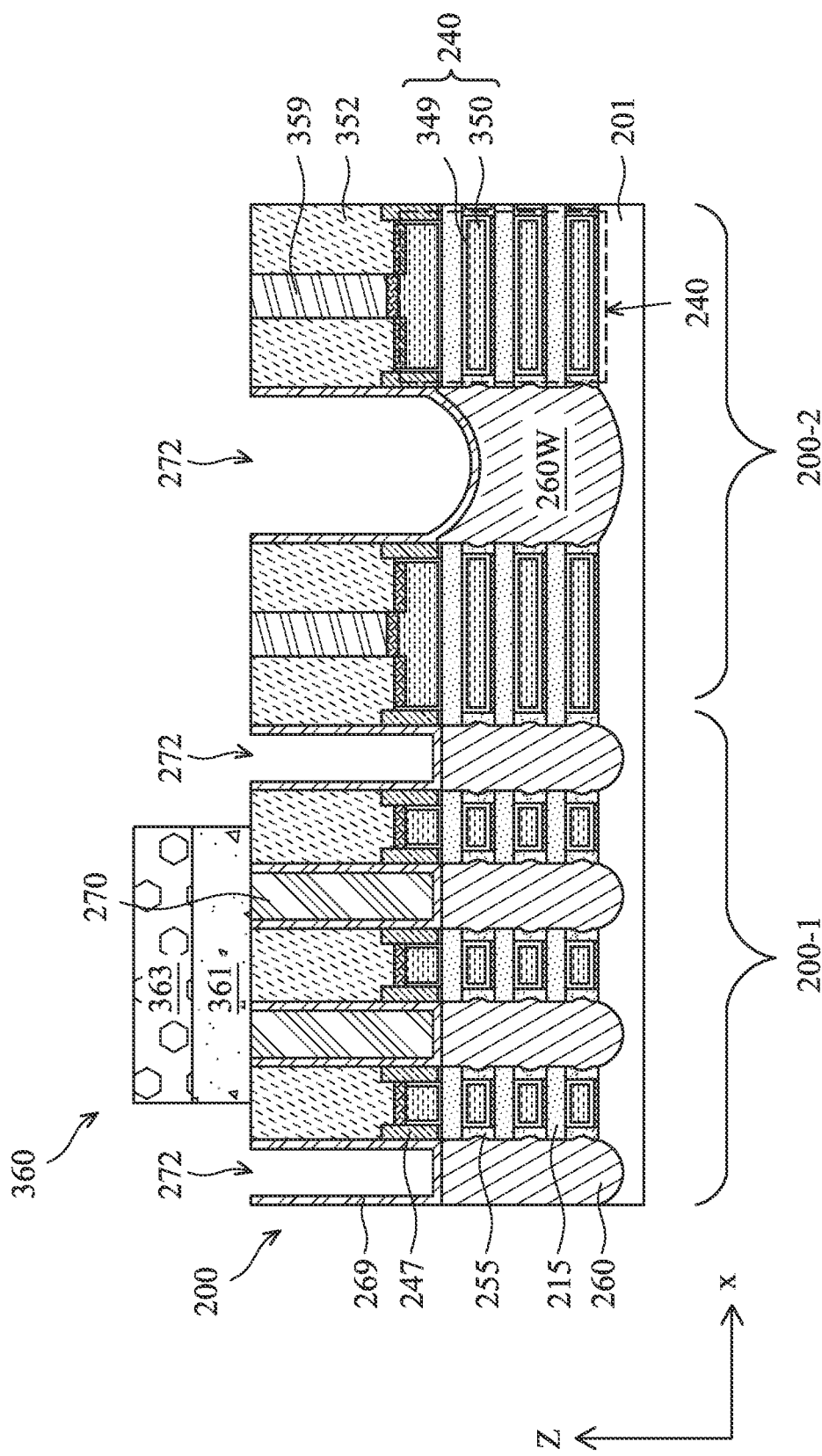

At operation 16, with the etch mask 360 in place, the method 10 (FIG. 1A) etches the semiconductor device 200 to form trenches 272, as shown in FIGS. 5A and 5B. In the present embodiment, the operation 16 applies one or more anisotropic dry etching processes to the semiconductor device 200. Using anisotropic dry etching processes, the etching is conformed to the shape and dimension of the etch mask 360. Further, the one or more anisotropic dry etching processes are tuned selective to the materials of the ILD layer 270 with little to no etching of other materials exposed through the etch mask 360 including the gate vias 359, the SAC layer 352, and the CESL 269. The etch mask 360 may be partially consumed during the etching processes. When the operation 16 finishes, trenches 272 are formed, which have the CESL 269 as their bottom and sidewall surfaces. Even though not explicitly shown, in the "y" direction, the trenches 272 may have the ILD layer 270 (under the etch mask 360) as their sidewall surfaces.

Figure 17:
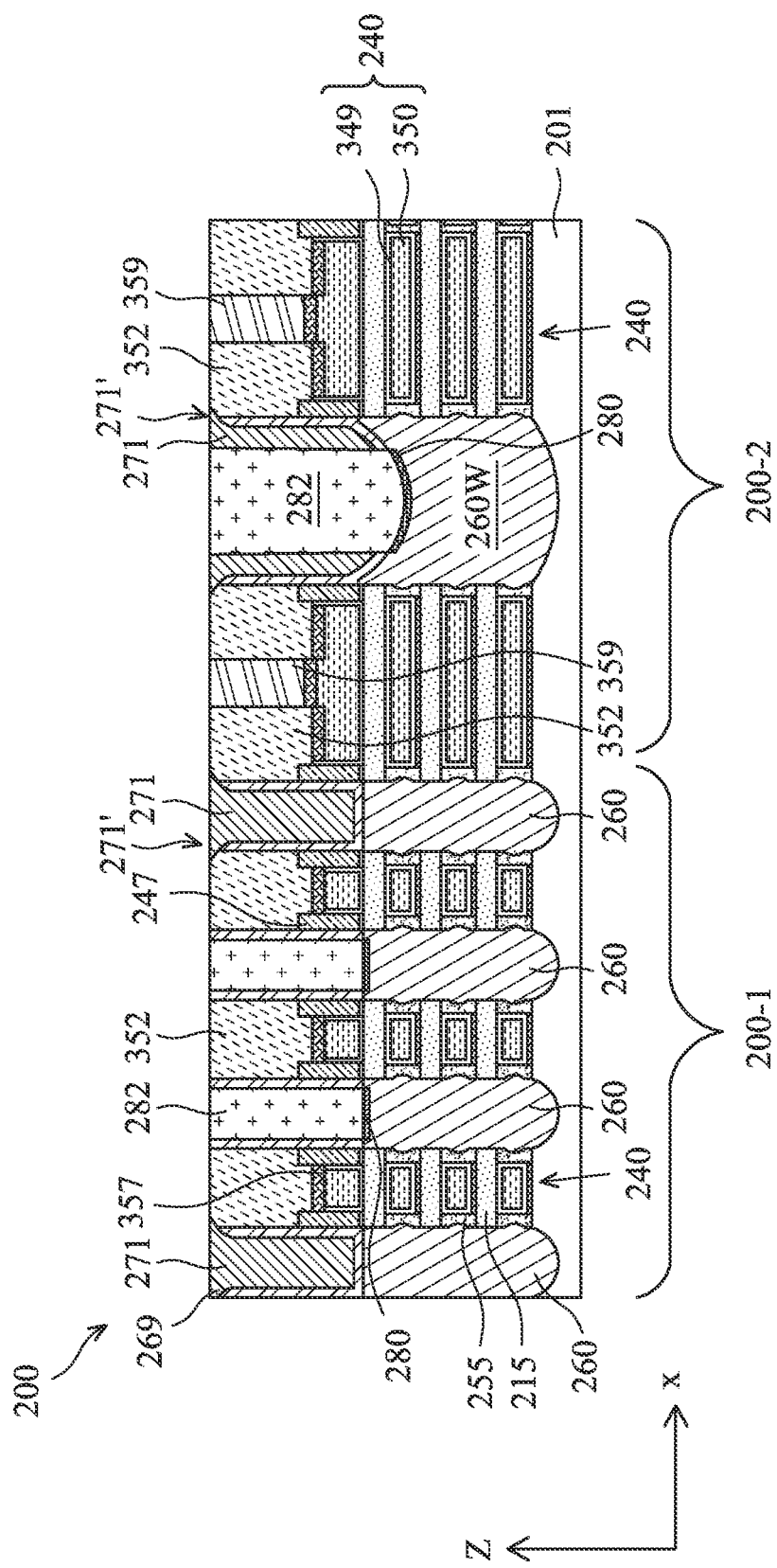
FIG. 17 is a cross-sectional view of a portion of the semiconductor device along the B-B line of FIG. 14A in accordance with another embodiment of the present disclosure.

In some embodiments, the upper corners of the SAC layer 352 and the CESL 269 that face the trenches 272 may become rounded as a result of the etching processes in operation 16. Thus, a subsequently deposited dielectric fill layer 271 may extend laterally (along the "x" direction) to areas directly above the CESL 269 and the SAC layer 352. For example, as shown in FIG. 17, portions 271' of the dielectric fill layer 271 extend directly above the CESL 269 and the SAC layer 352.

Figure 6A:
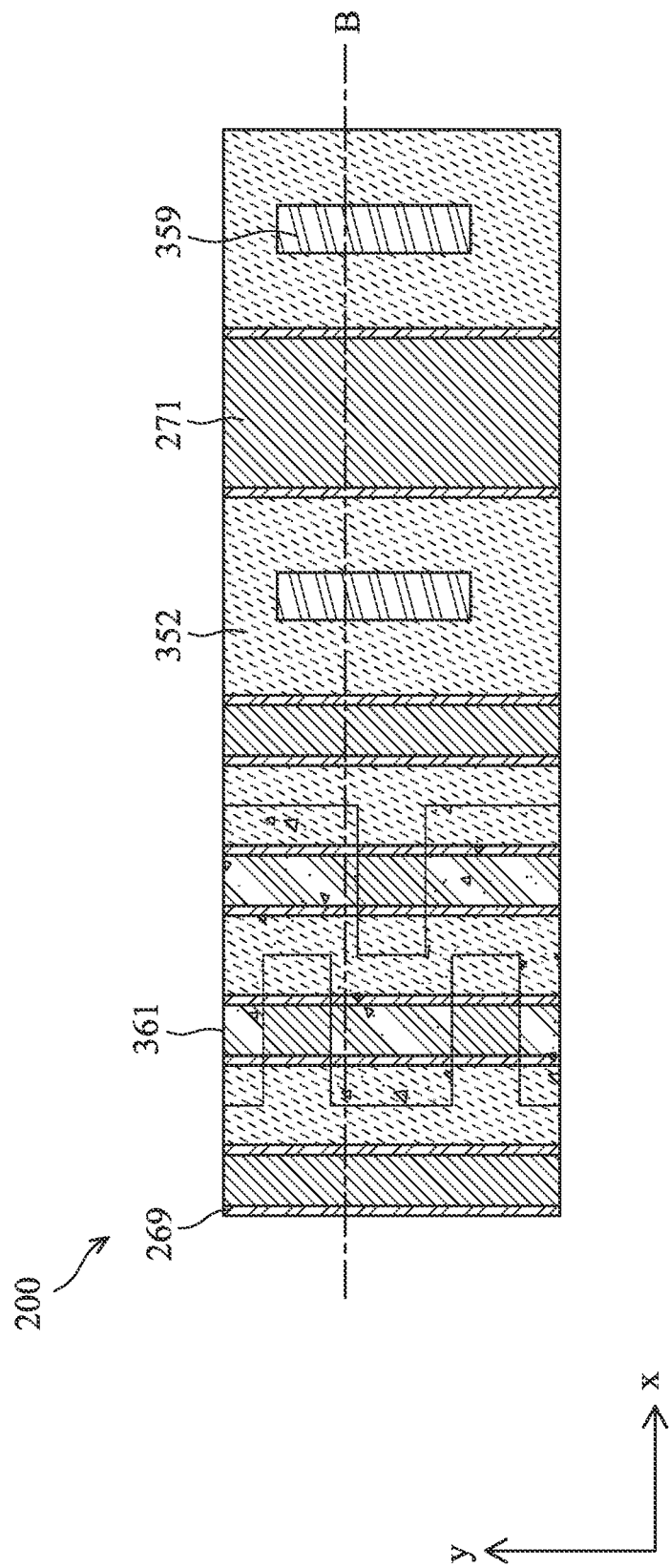
Figure 6B:
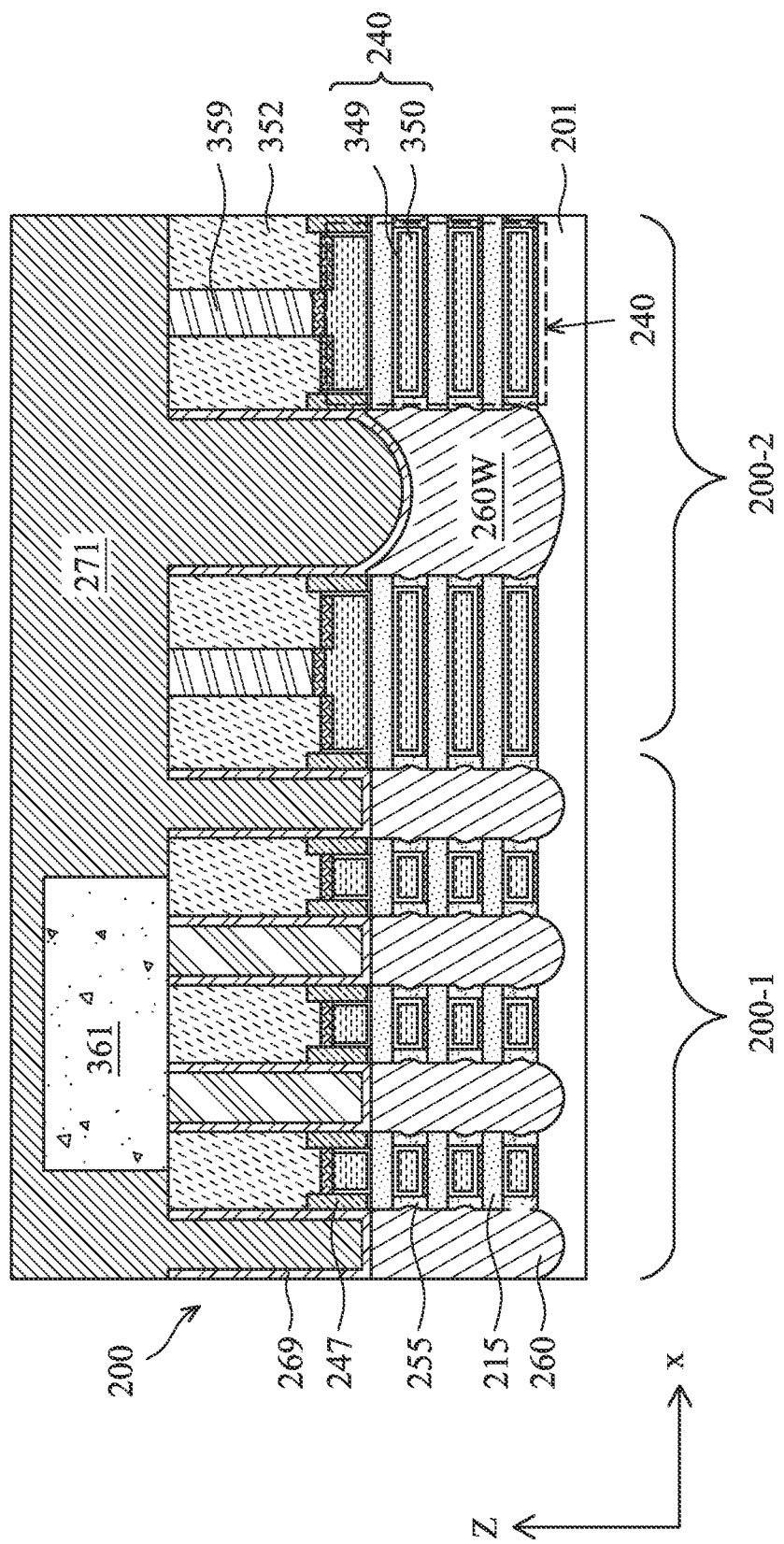

At operation 18, the method 10 (FIG. 1A) deposits a dielectric fill layer (or a dielectric filler) 271 over the semiconductor device 200 and filling the trenches 272, such as shown in FIGS. 6A and 6B. In the depicted embodiment, the resist pattern 363 is removed (for example, by resist stripping) prior to the deposition of the dielectric fill layer 271. However, the patterned hard mask 361 (or a portion thereof) remains and is covered by the dielectric fill layer 271. The patterned hard mask 361 is not removed at this fabrication stage so that it still protects the underlying portion of the ILD layer 270. On the other hand, removing the patterned hard mask 361 at this fabrication stage might inadvertently etch the underlying portion of the ILD layer 270, which might affect the profile of subsequently formed S/D contacts. In the present embodiment, the dielectric fill layer 271 includes a material that is different from the materials included in the ILD layer 270 in order to achieve etch selectivity in a subsequent etching process (discussed in operation 22 below). In an embodiment, the dielectric fill layer 271 includes $Si_3N_4$, SiCN, SiC, SiOC, SiOCN, $HfO_2$, $ZrO_2$, $ZrAlO_x$, $HfAlO_x$, $HfSiO_x$, $Al_2O_3$, or a combination thereof. The dielectric fill layer 271 may be deposited using CVD, FCVD, PVD, ALD, HDPCVD, MOCVD, RPCVD, PECVD, LPCVD, ALCVD, APCVD, other suitable methods, or combinations thereof.

Figure 7A:
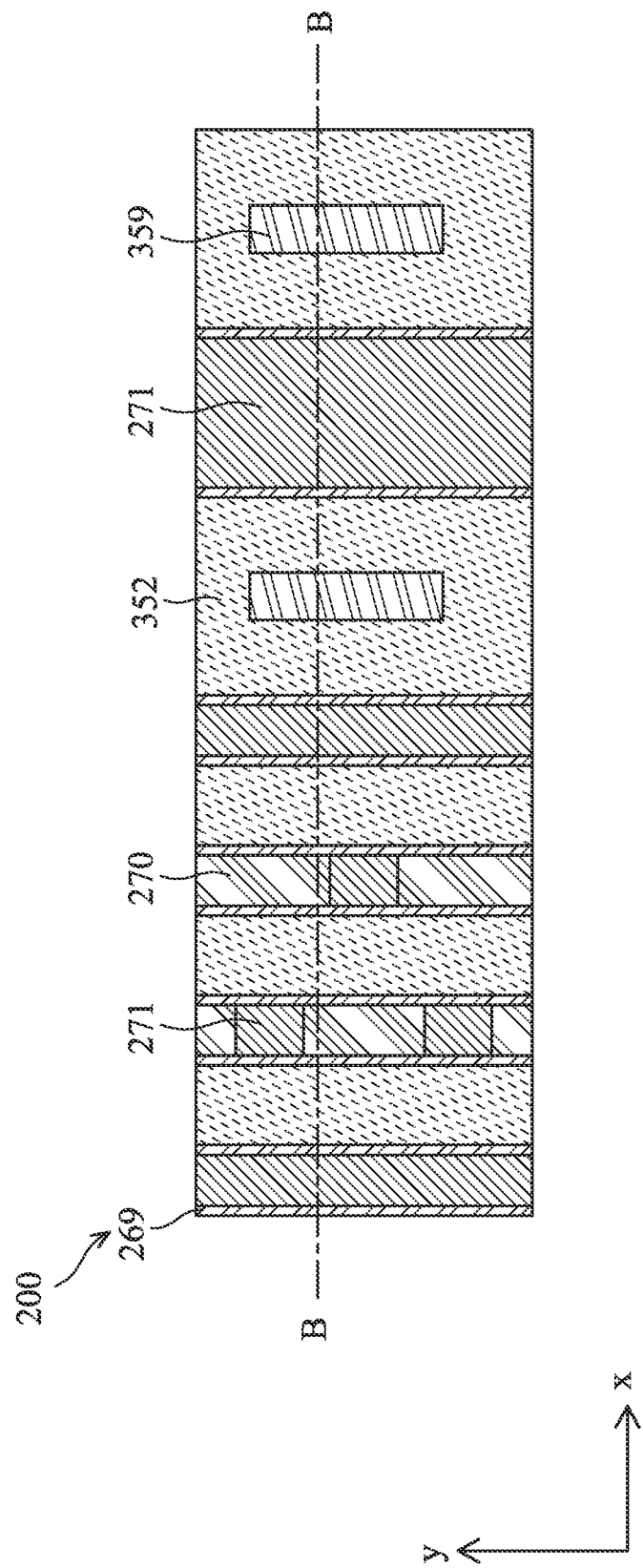
Figure 7B:
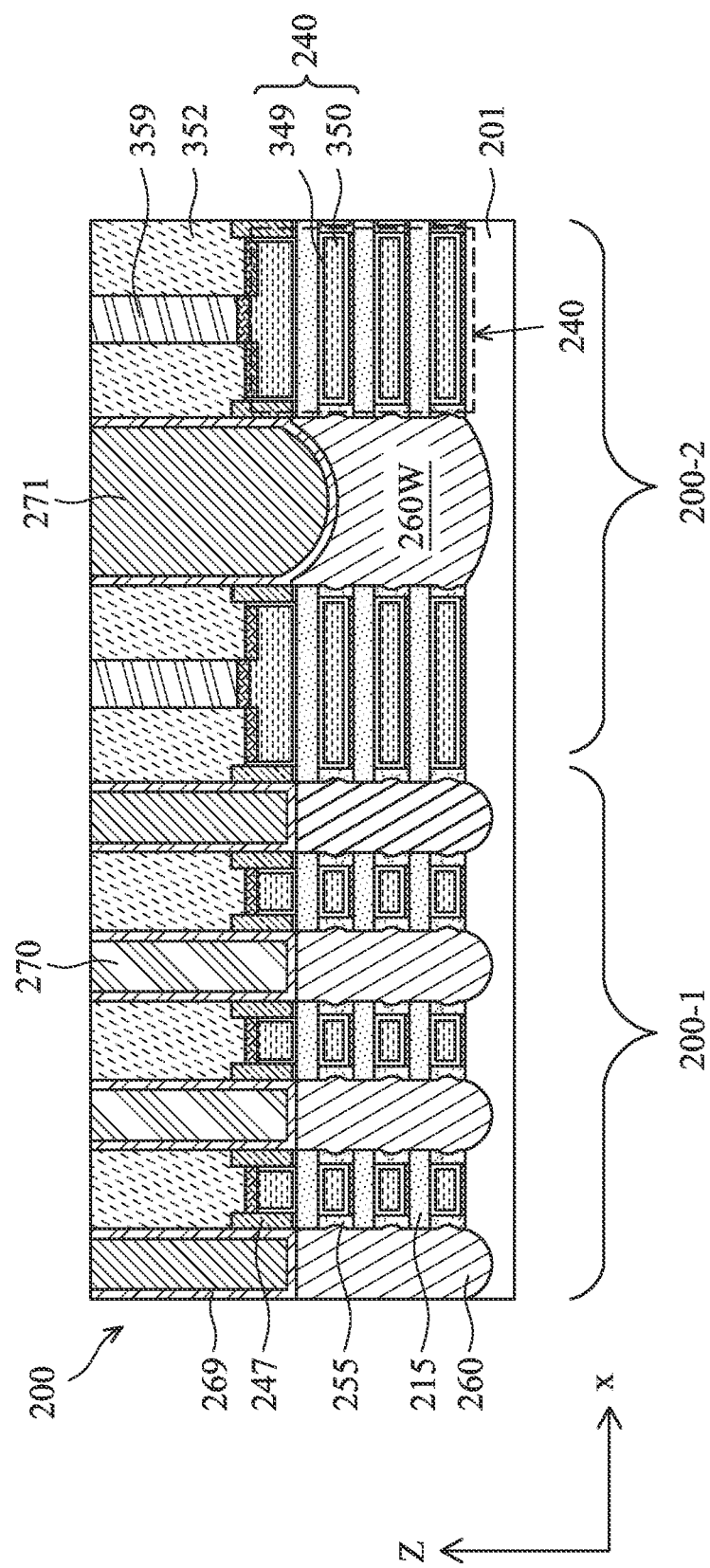

At operation 20, the method 10 (FIG. 1A) performs a CMP process to the dielectric fill layer 271 and the patterned hard mask 361 until the ILD layer 270 is exposed, such as shown in FIGS. 7A and 7B. The ILD layer 270 serves as a CMP stop in an embodiment. Referring to FIGS. 7A and 7B, the dielectric fill layer 271 and the patterned hard mask 361 are removed from the top surface of the semiconductor device 200. The remaining portions of the dielectric fill layer 271 fill the trenches 272. The ILD layer 270 is exposed for further processing.

Figure 8A:
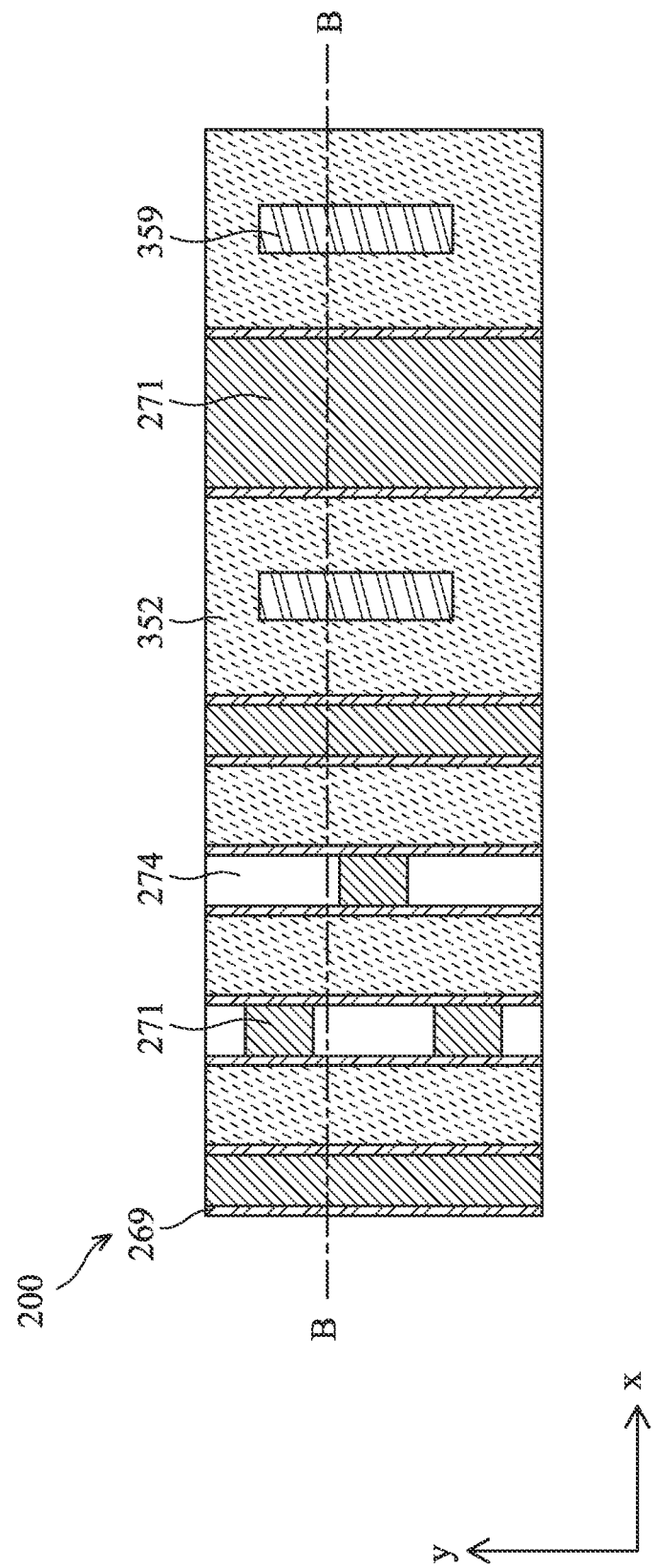
Figure 8B:
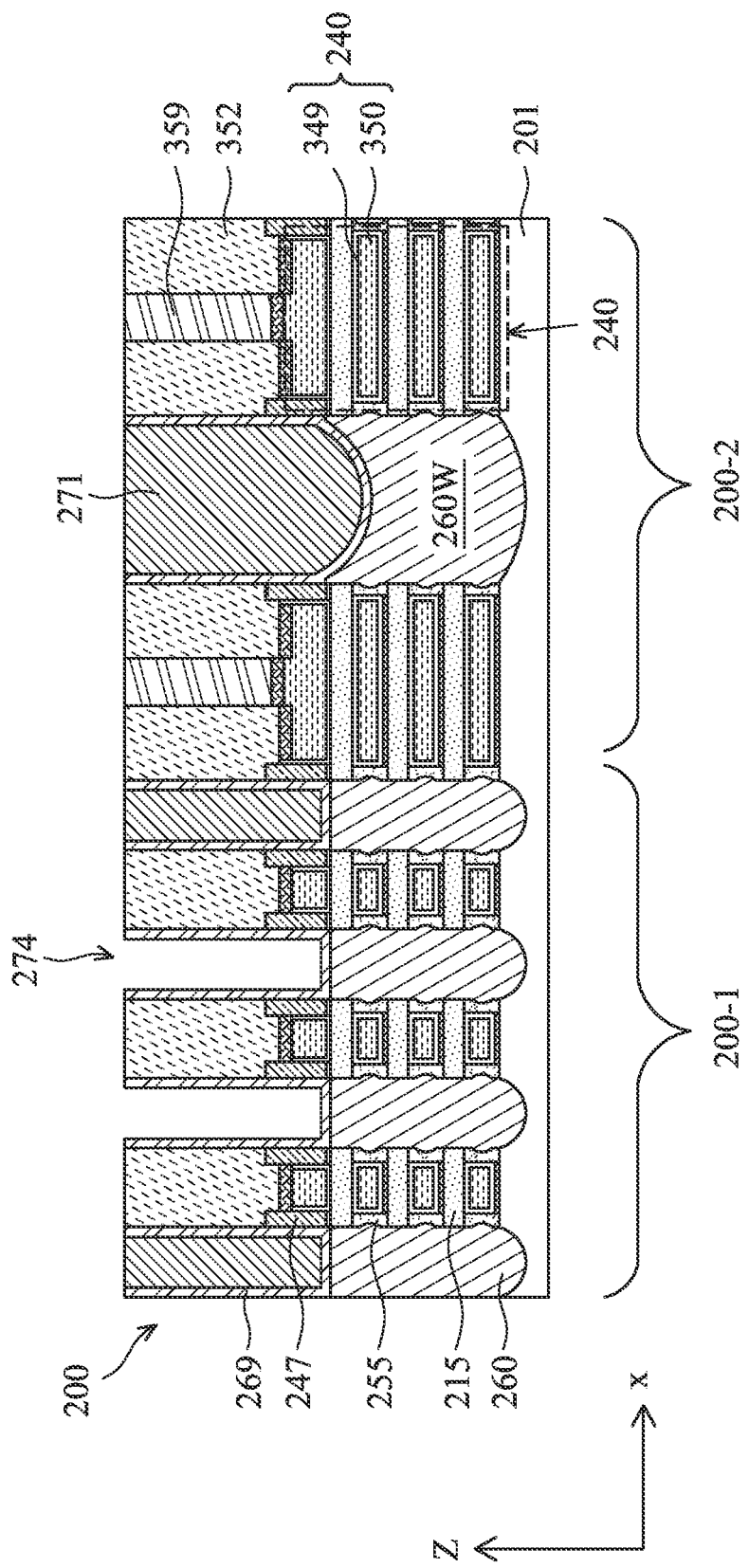
Figure 14A:
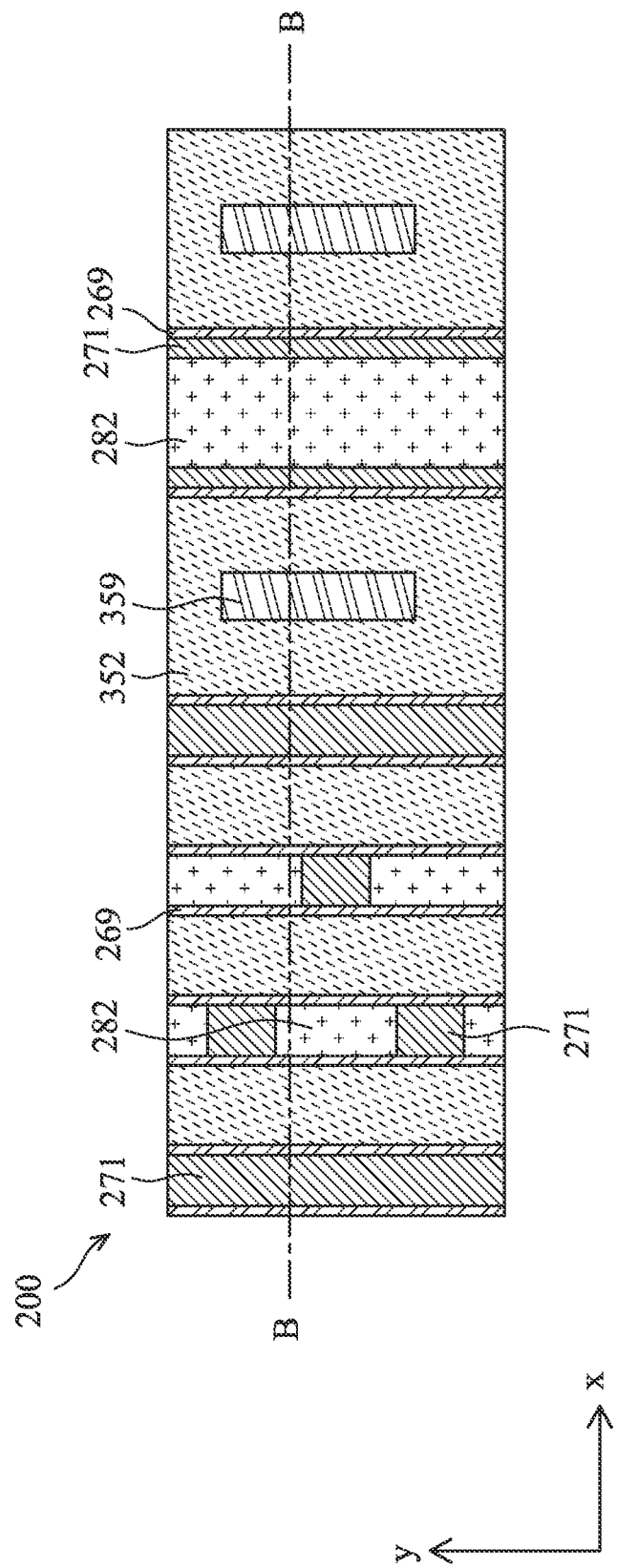
Figure 14B:
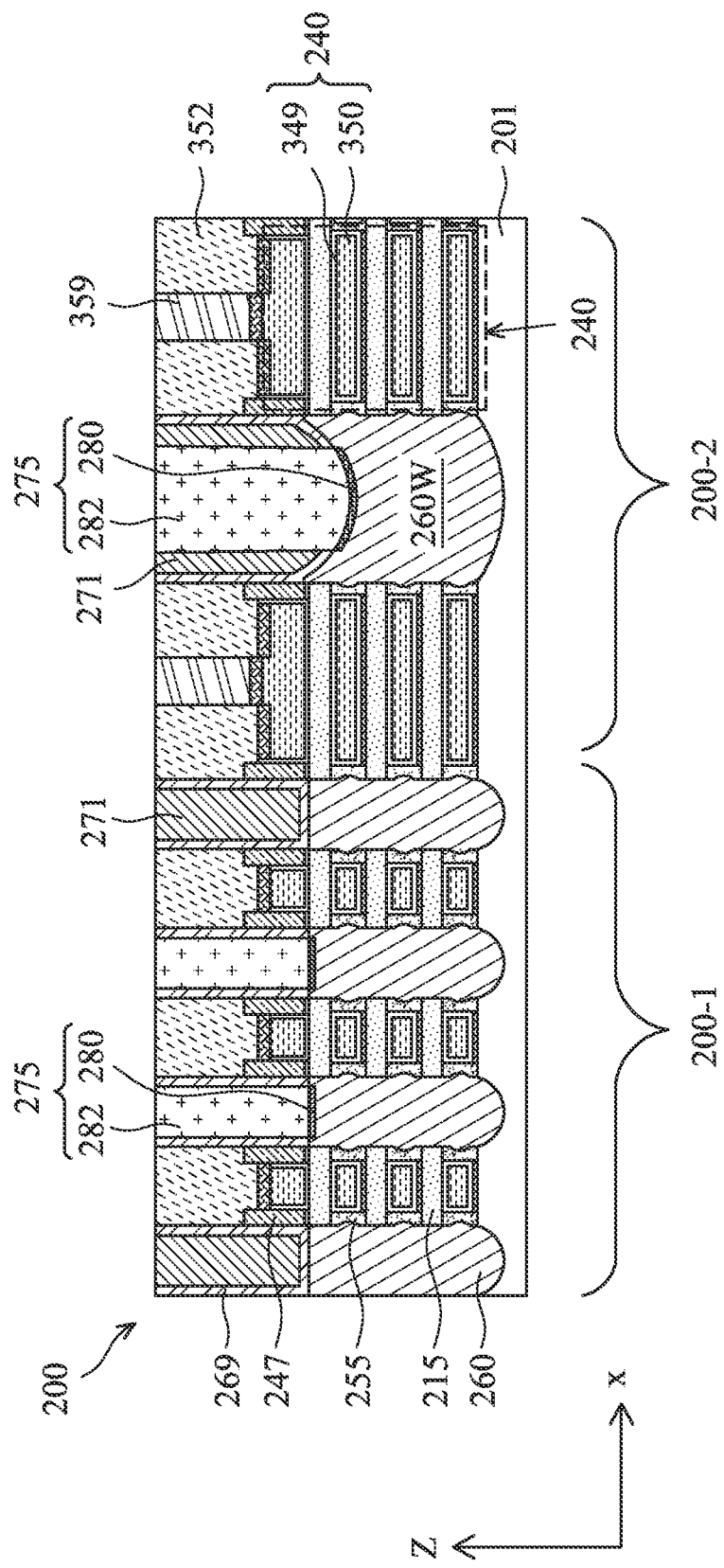

At operation 22, the method 10 (FIG. 1A) etches the ILD layer 270 using an isotropic etching process to form trenches 274, such as shown in FIGS. 8A and 8B. Using the isotropic etching process of the present disclosure, the trenches 274 are formed with vertical or substantially vertical sidewalls. The sidewalls of the trenches 274 along the "y" direction are the CESL 269 (see FIG. 8B) and the sidewalls of the trenches 274 along the "x" direction are the dielectric fill layer 271 (see FIG. 8A). As will be discussed, metal compounds 282/280 will be filled into the trenches 274 to form S/D contacts 275, such as shown in FIG. 14B. With the trenches 274 having vertical or substantially vertical sidewalls, the S/D contacts 275 on adjacent S/D electrodes 260 are kept away from each other at a maximum possible distance along both the "x" direction and the "y" direction. This greatly improves TDDB (Time Dependent Dielectric Breakdown) performance of the semiconductor device 200. In some approaches, trenches for S/D contacts are etched by anisotropic etching processes, such as plasma dry etching. The anisotropic etching processes involve ion bombardment to the exposed surfaces. Consequently, the corners of the CESL 269 and the SAC layer 352 that face the trenches would become rounded. With trenches having such rounded top corners, the subsequently formed S/D contacts would extend laterally into areas above the CESL 269 and the SAC layer 352, which would reduce the distance between adjacent S/D contacts and lead to less-than-ideal TDDB performance. Further, such anisotropic etching processes might also undesirably reduce the height of the SAC layer 352.

In the present embodiment, the isotropic etching process of the operation 22 is a dry etching process that applies one or more chemicals to react with the ILD layer 270. Further, the dry etching process is selective to the materials in the ILD layer 270. In other words, the one or more chemicals in the dry etching process are much more reactive with the ILD layer 270 than with the other layers including the SAC layer 352, the gate vias 359, the CESL 269, and the dielectric fill layer 271. In some embodiments, an etch selectivity between the ILD layer 270 and the other layers in the isotropic etching process is about 50:1 or larger. In other words, the isotropic etching process etches the ILD layer 270 50 (or more) times faster than etching the other layers. In an embodiment, the isotropic etching process applies HF, $NH_3$, $NF_3$, or a combination thereof as the etching chemical(s). Such chemicals provide the desired etch selectivity for the various layers discuss above. Further, the isotropic etching process may apply water vapor ($H_2O$) as a catalyst in some embodiments depending on the etching chemical(s) used and the materials in the various layers. Still further, the isotropic etching process may use $N_2$, Ar, or a combination thereof as a carrier gas for the one or more etching chemicals. With the isotropic etching process, the trenches 274 are formed with vertical or substantially vertical sidewalls, such as shown in FIG. 8B.

Figure 9A:
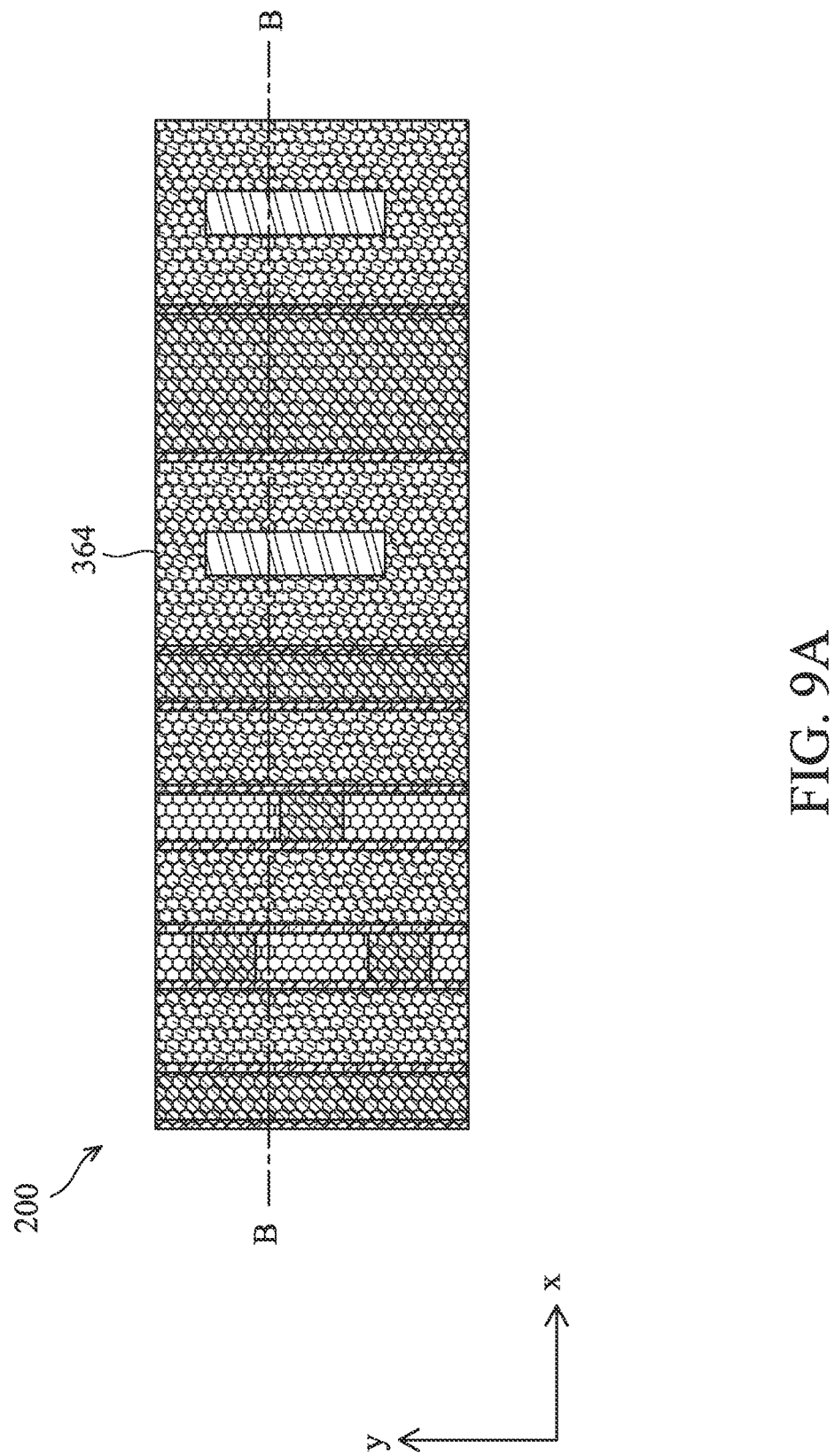
Figure 9B:
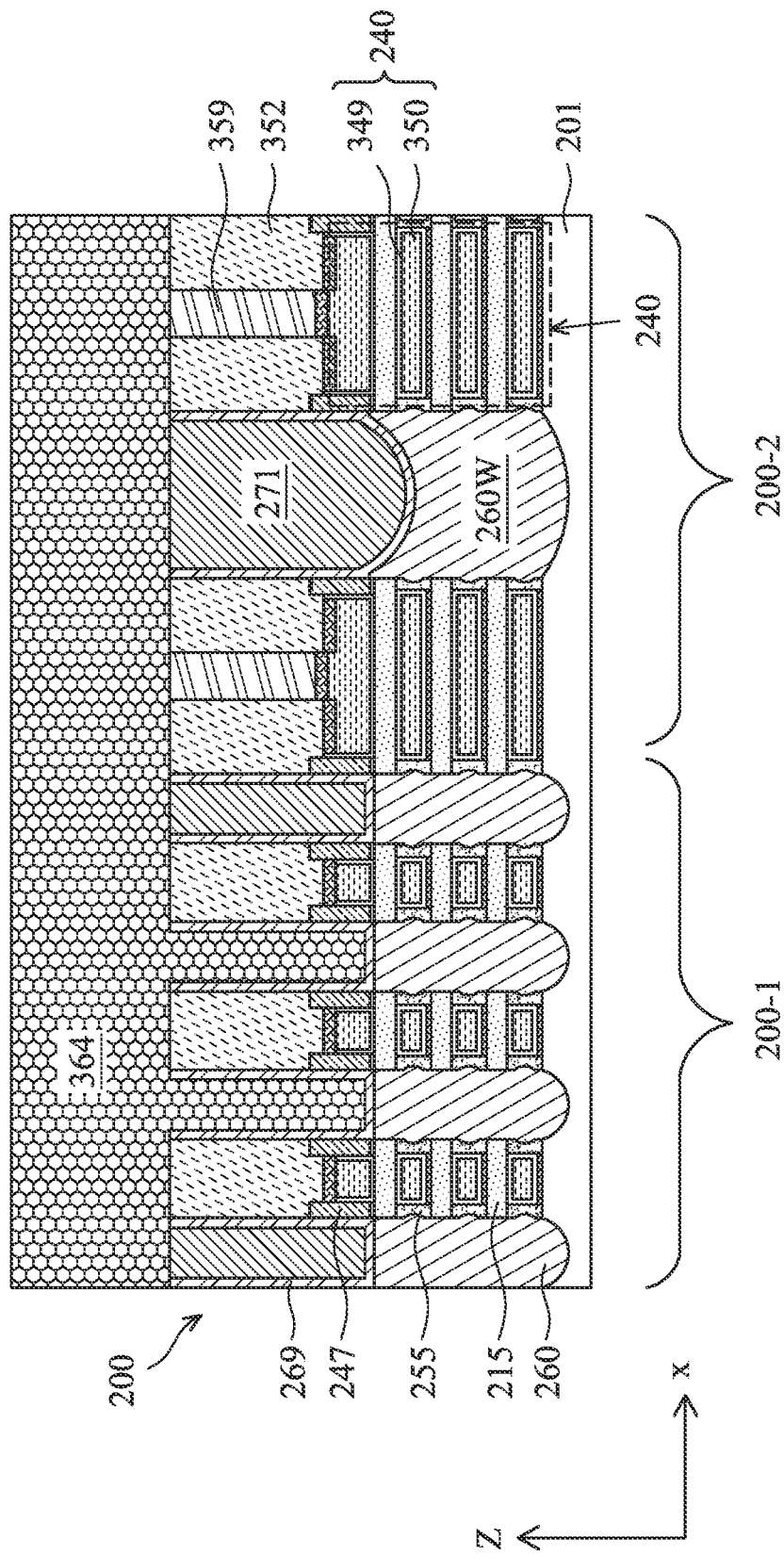
Figure 10A:
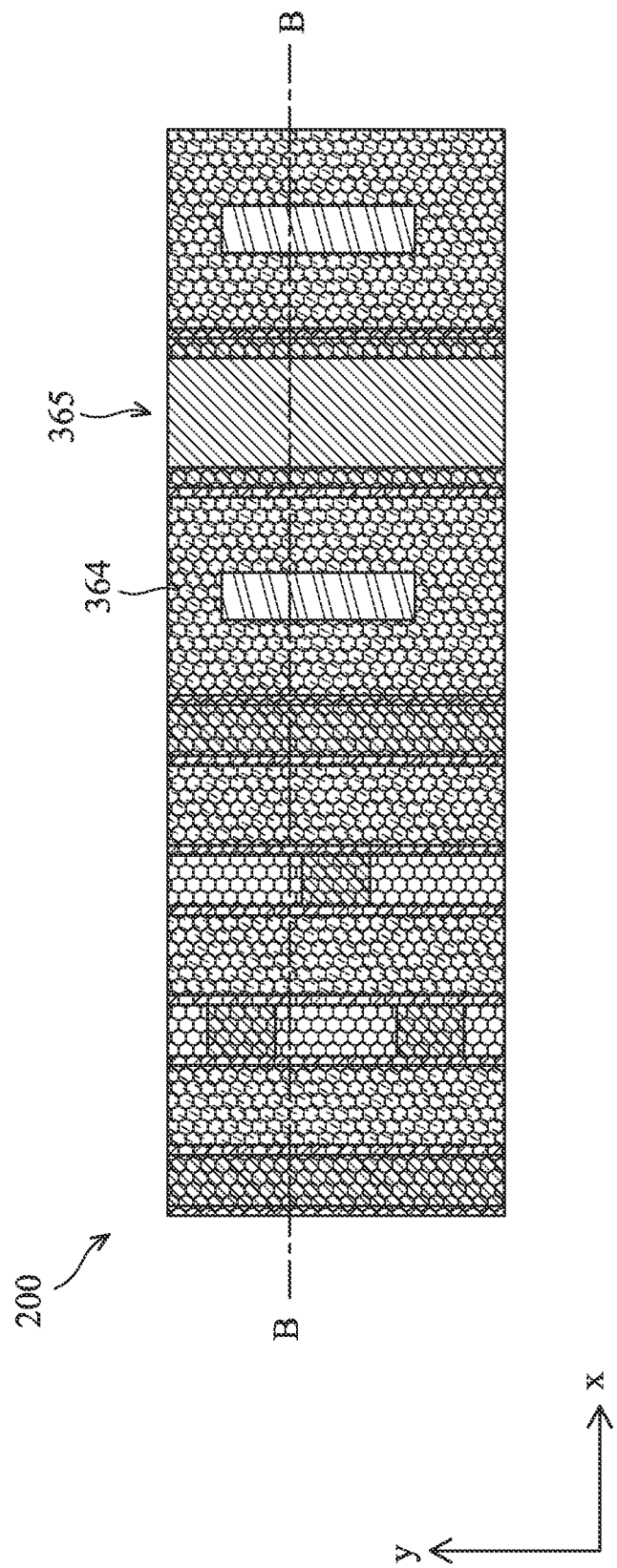
Figure 10B:
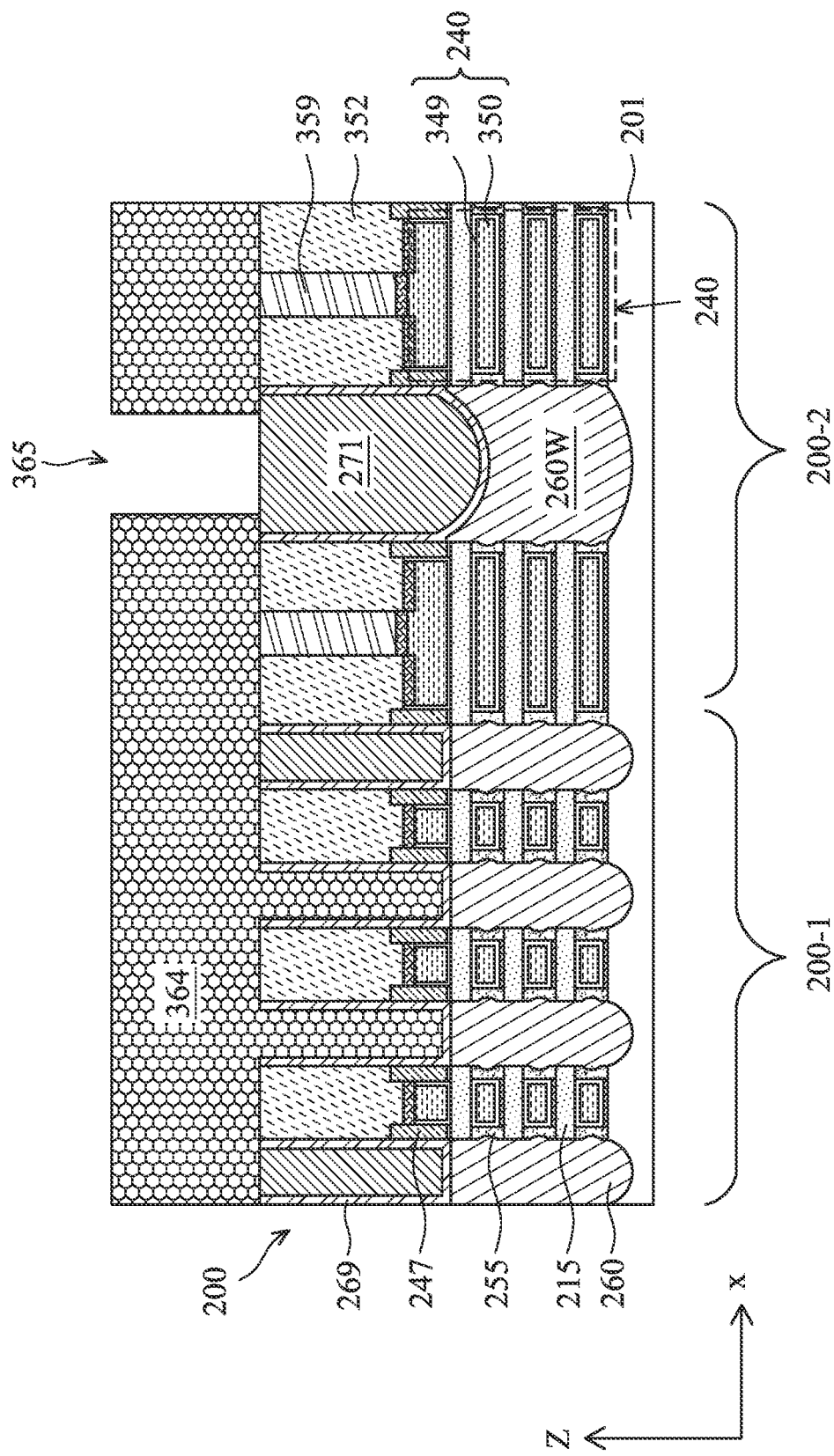

At operation 24, the method 10 (FIG. 1B) forms another etch mask 364 over the semiconductor device 200, such as shown in FIGS. 9A-9B and 10A-10B. Referring to FIGS. 9A-9B, the etch mask 364 is deposited over the semiconductor device 200 and fills the trenches 274. In an embodiment, the etch mask 364 includes a photoresist layer, which is spin-coated over the semiconductor device 200. In another embodiment, the etch mask 364 includes an antireflective coating (ARC) layer over the semiconductor device 200 and filling the trenches 274 and further includes a photoresist layer spin-coated over the ARC layer. Referring to FIGS. 10A-10B, the etch mask 364 is patterned to provide openings 365 (one shown) in the region 200-2, for example, using a photolithography process and optionally an etching process. The openings 365 are provided above the S/D electrodes 260w. Further, the openings 365 are formed narrower than the underlying S/D electrodes 260w along the "x" direction. This advantageously provides sufficient opening for S/D contacts that are landed on the S/D electrodes 260w and keeps sufficient distance from nearby gate vias 359 to reduce coupling capacitance. The openings 365 expose the dielectric fill layer 271 that are directly above the S/D electrodes 260w.

Figure 11A:
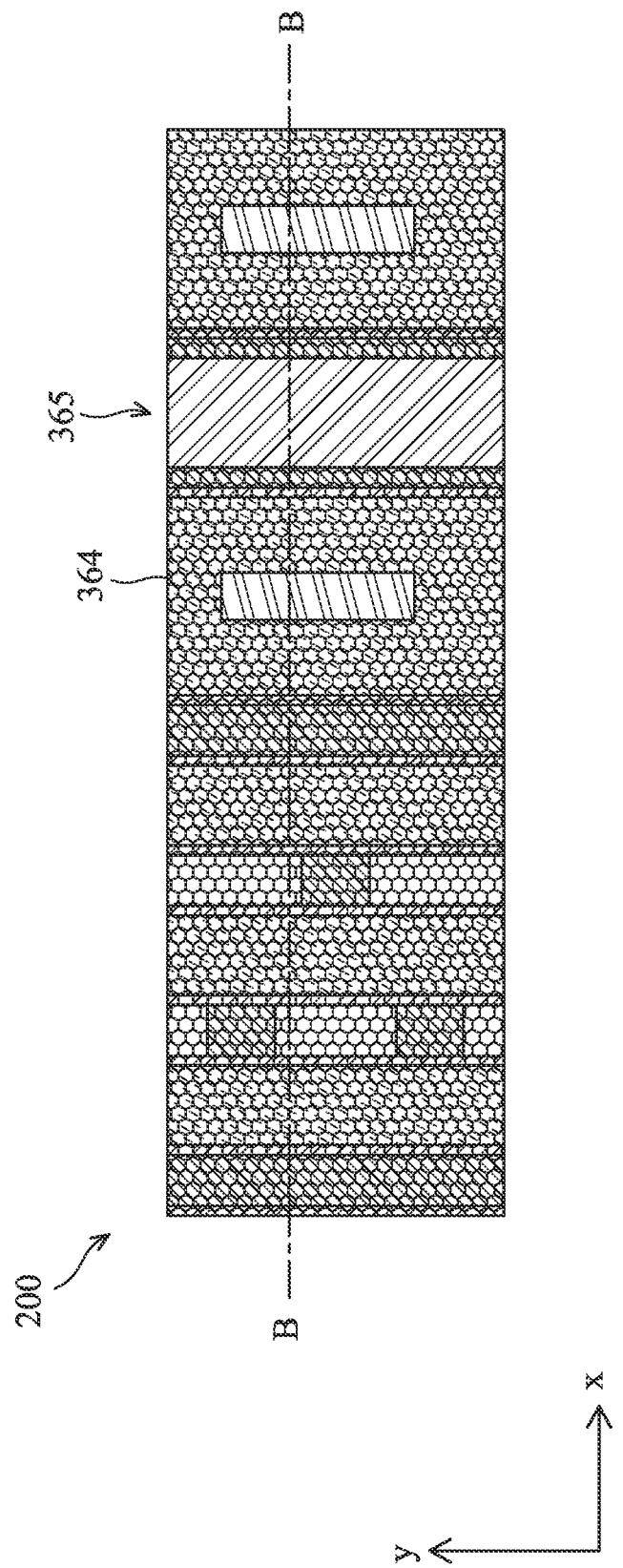
Figure 11B:
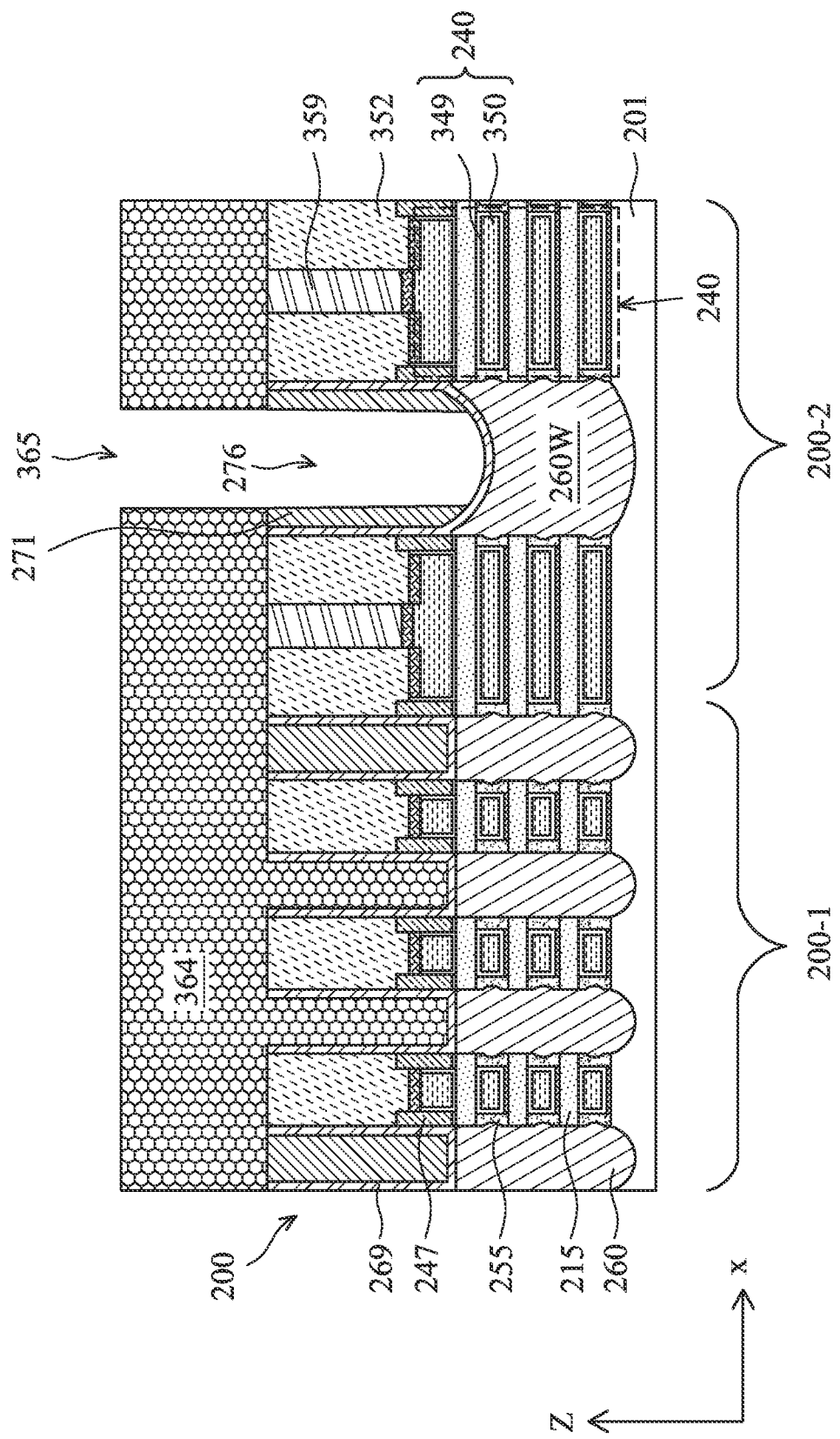

At operation 26, the method 10 (FIG. 1B) etches the dielectric fill layer 271 through the openings 365 to form trenches 276 into the dielectric fill layer 271, such as shown in FIGS. 11A-11B. The trenches 276 expose the CESL 269 that are directly above the S/D electrodes 260w. In an embodiment, the operation 26 applies an anisotropic etching process so that the trenches 276 are formed with vertical or substantially vertical sidewalls. Further, using the anisotropic etching process helps keep the dimensions of the trenches 276 to substantially match those of the openings 365 (from a top view). If an isotropic etching process is used, the dimensions of the trenches 276 would tend to be greater than those of the openings 365 (from a top view). Because the etch mask 364 protects the top corners of the dielectric fill layer 271 that face the trenches 276, those top corners maintain sharp edges, rather than becoming rounded. The anisotropic etching process is selective to the materials in the dielectric fill layer 271 and has little to no etching to the CESL 269. As a result, the CESL 269 is exposed at the bottom of the trenches 276.

Figure 12A:
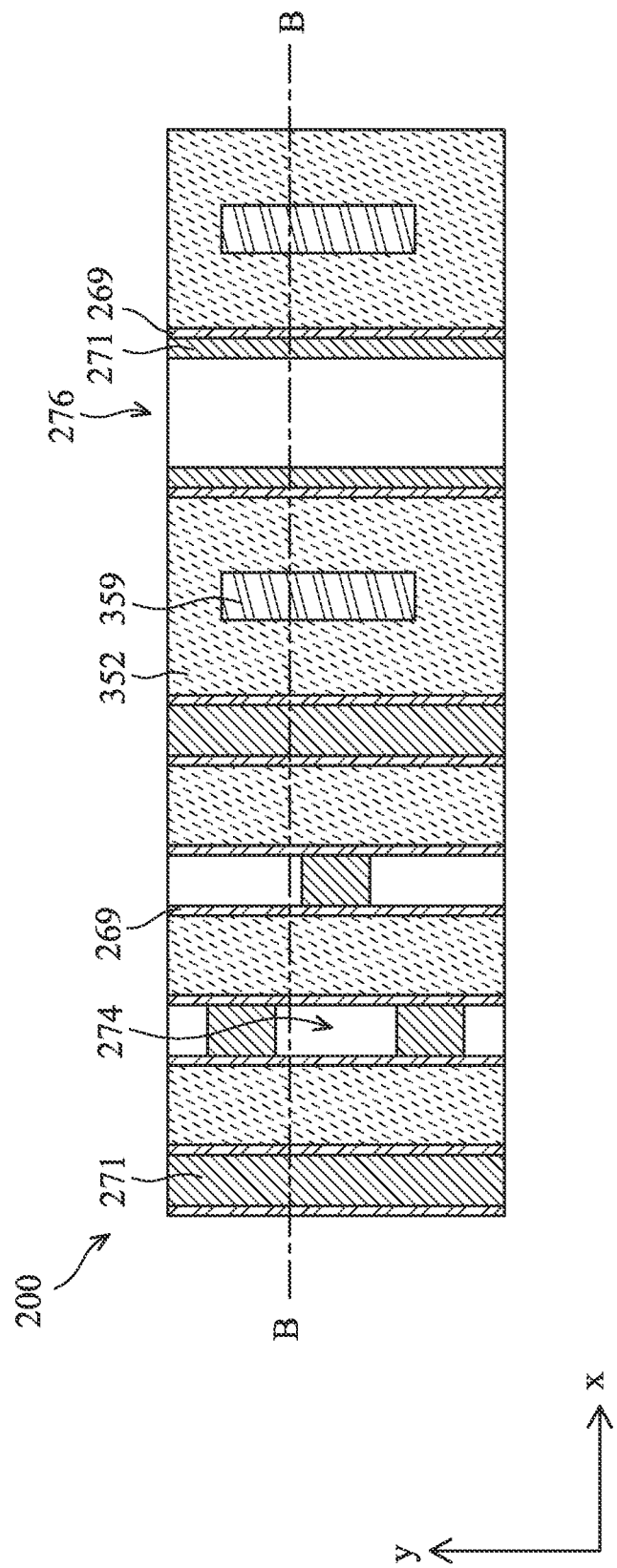
Figure 12B:
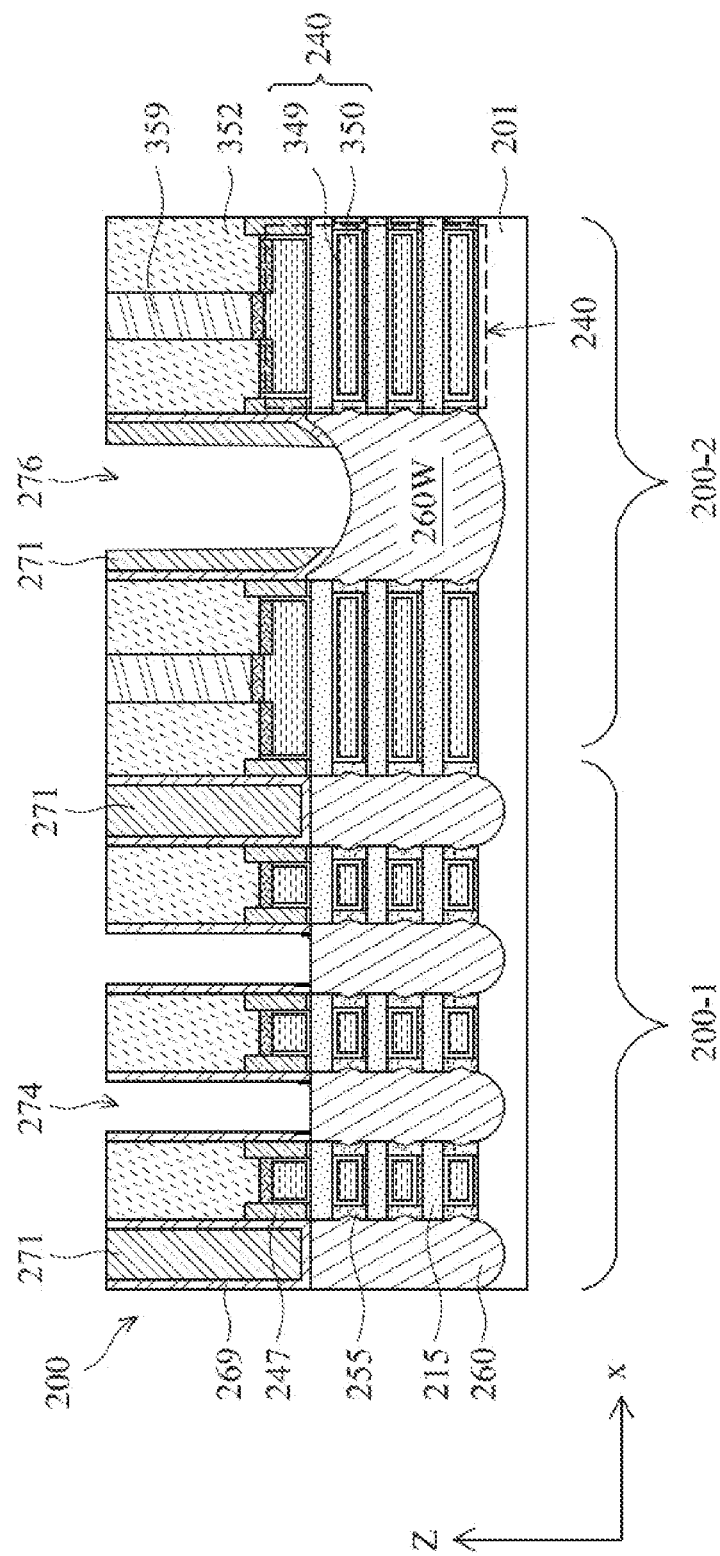

At operation 28, the method 10 (FIG. 1B) removes the etch mask 364, for example, using resist stripping and/or other methods. This regains the trenches 274, such as shown in FIGS. 12A-12B. Then, the operation 28 performs an anisotropic etching process to the CESL 269 that are exposed in the trenches 274 and 276, thereby removing the portions of CESL 269 that are in the trenches 274 and 276 and directly above the S/D electrodes 260 and 260w, such as shown in FIGS. 12A-12B. The CESL 269 remains on the sidewalls of the trenches 274 and 276 due to the use of the anisotropic etching process. The top surfaces of the S/D electrodes 260 and 260w are exposed in the trenches 274 and 276 for further processing. The anisotropic etching process is tuned to be selective to the materials in the CESL 269 and with little to no etching to the SAC layer 352, the gate vias 359, the dielectric fill layer 271. In some embodiments, the operation 28 further cleans the top surfaces of the S/D electrodes 260 and 260w for subsequent silicide formation by removing any oxidation or contaminants thereon.

Figure 13A:
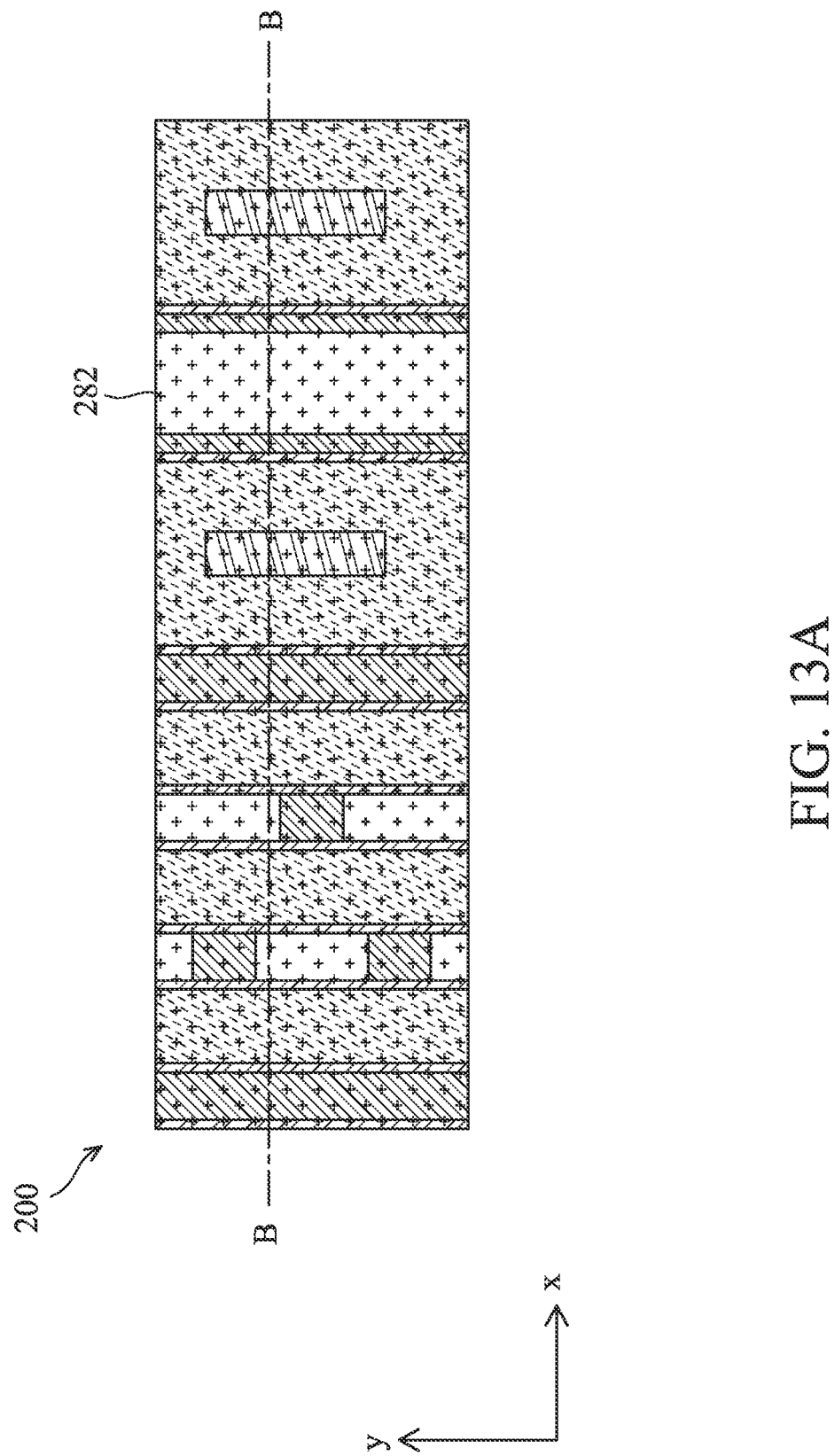
Figure 13B:
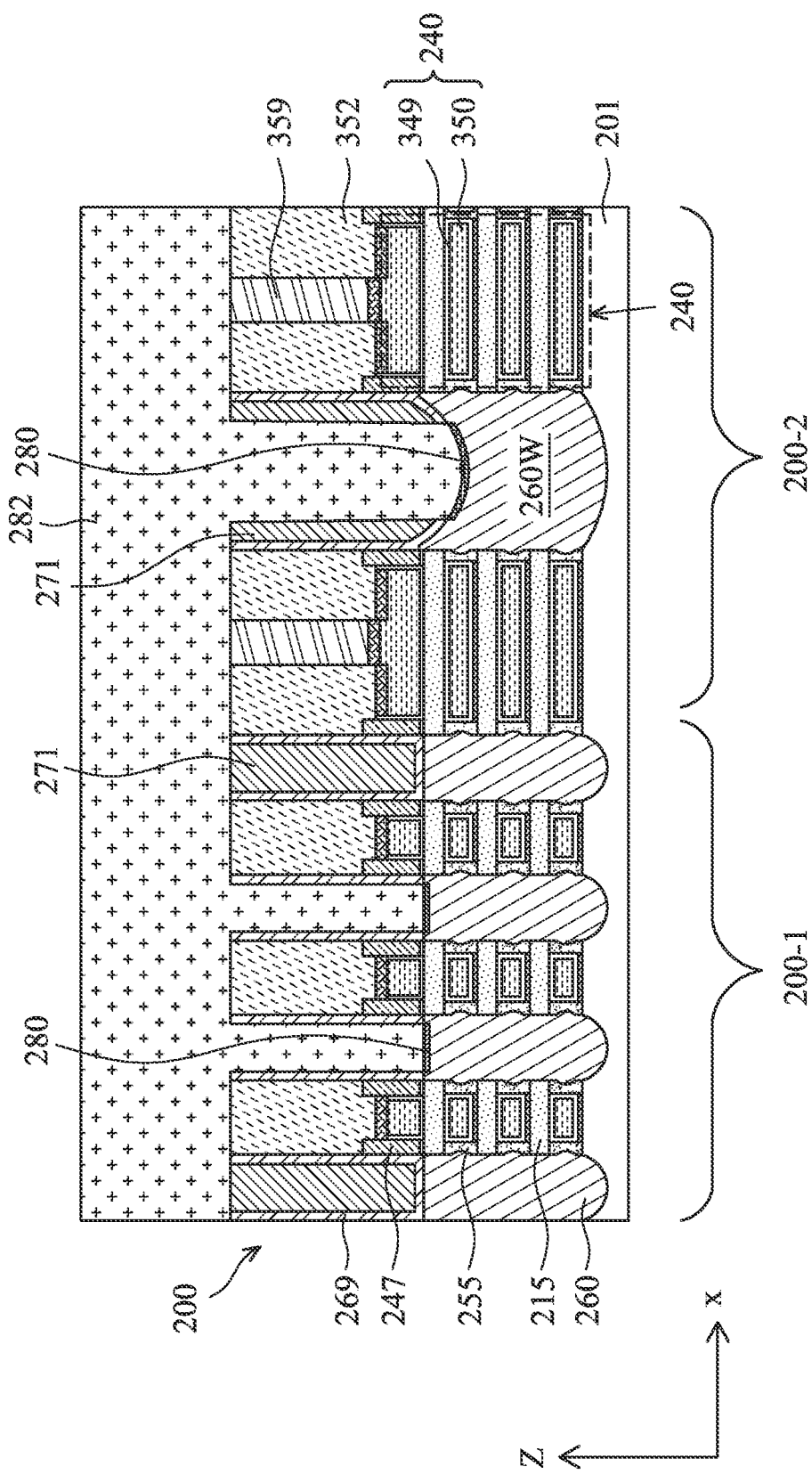

At operation 30, the method 10 (FIG. 1B) form S/D contacts 275 in the trenches 274 and 276 and electrically connected to the S/D electrodes 260 and 260w. Referring to FIGS. 13A-13B, the operation 30 forms silicide features 280 in the trenches 274 and 276. To form the silicide features 280, the operation 30 may deposit one or more metals into the trenches 274 and 276, perform an annealing process to the semiconductor device 200 to cause reaction between the one or more metals and the S/D electrodes 260 and 260w to produce the silicide features 280, and remove un-reacted portions of the one or more metals, leaving the silicide features 280 in the trenches 274 and 276. The one or more metals may include titanium (Ti), tantalum (Ta), tungsten (W), nickel (Ni), platinum (Pt), ytterbium (Yb), iridium (Ir), erbium (Er), cobalt (Co), other noble metals, other refractory metals, rare earth metals, or their alloys, and may be deposited using CVD, PVD, ALD, or other suitable methods. The silicide features 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

After forming the silicide features 280, the operation 30 deposits a metal layer 282 into the trenches 274 and 276 and in direct contact with the silicide features 280, such as shown in FIGS. 13A-13B. The metal layer 282 fully fills the trenches 274 and 276. In embodiments, the metal layer 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. Then, the operation 30 performs a CMP process to remove excessive materials of the metal layer 282 above the top surface of the semiconductor device 200, such as shown in FIGS. 14A-14B, thereby forming the S/D contacts 275. The S/D contacts 275 include silicide features 280 and portions of the metal layer 282, which are metallic compounds or metal compounds.

Figure 15A:
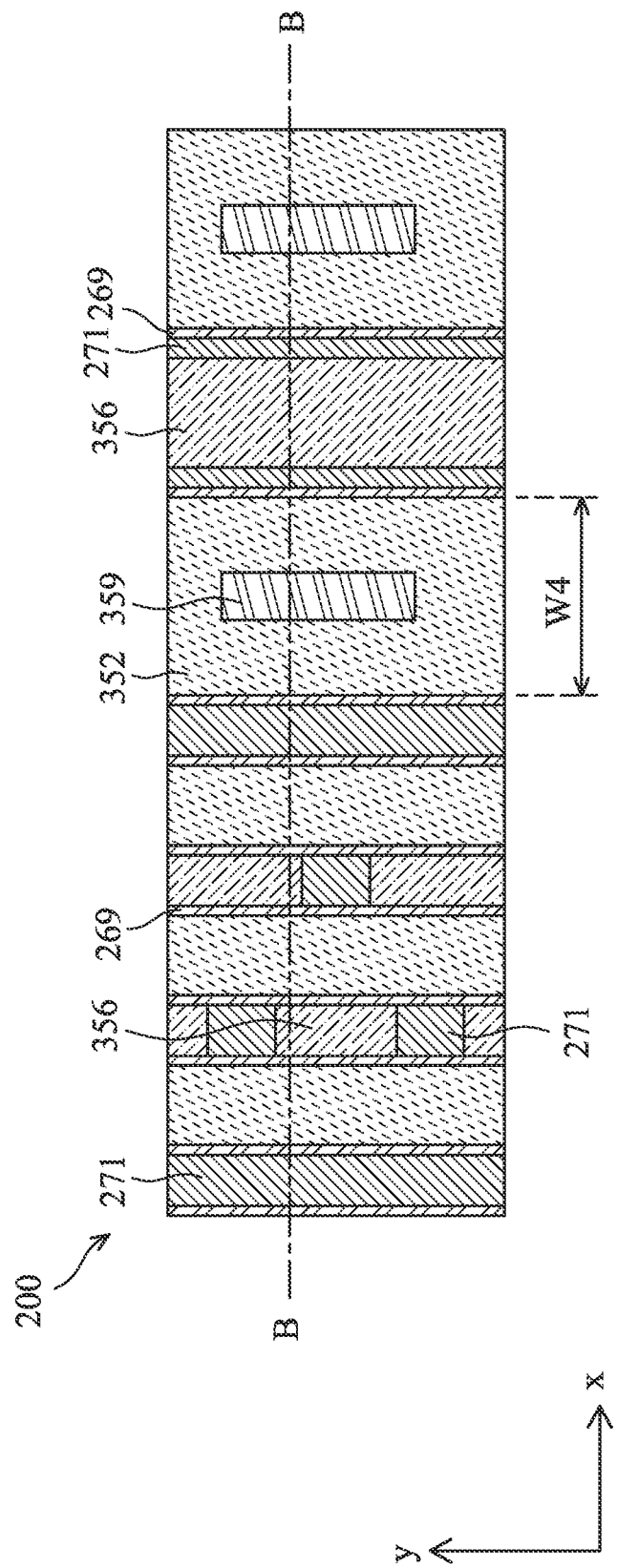
Figure 15B:
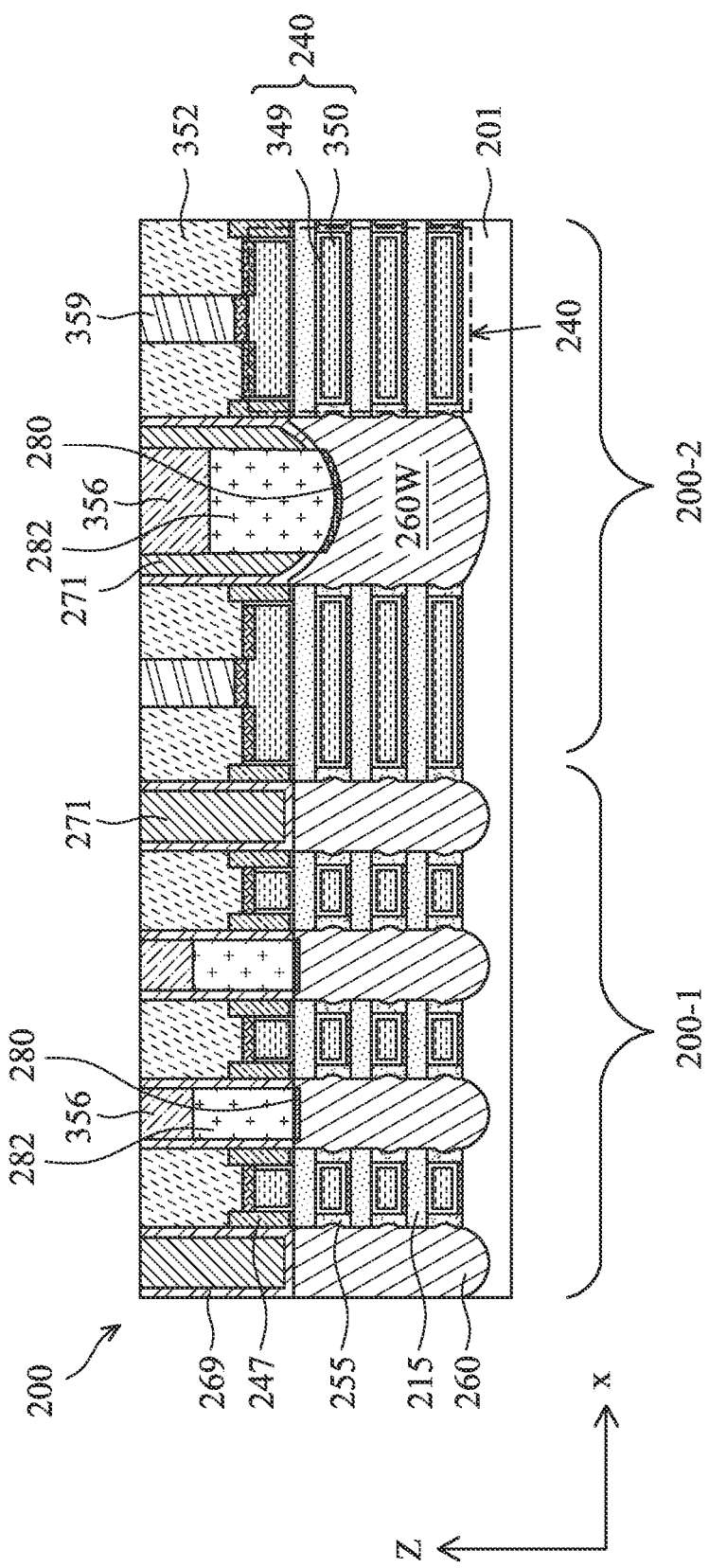

At operation 32, the method 10 (FIG. 1B) performs further fabrication to the semiconductor device 200. In an embodiment, the operation 32 forms a dielectric cap 356 over the S/D contacts 275, such as shown in FIGS. 15A-15B. In an embodiment, the dielectric cap 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric cap 356 protects the S/D contacts 275 from etching and CMP processes and isolating the S/D contacts 275 from the interconnect structure formed thereon (other than in areas where the S/D contact 275 are vertically connected to the interconnect structure). In some embodiments, the SAC layer 352 and the dielectric cap 356 include different materials to achieve etch selectivity. In some alternative embodiments, the semiconductor device 200 includes the SAC layer 352, but not the dielectric cap 356. In some other alternative embodiments, the semiconductor device 200 includes the dielectric cap 356, but not the SAC layer 352. In some embodiments, the dielectric cap 356 may have a thickness of 0 nm (not existent) to about 50 nm, for example. The operation 32 may further form S/D contact vias connected to the S/D contacts 275, form multi-layer interconnects over the S/D contacts 275, and so on.

Figure 16:
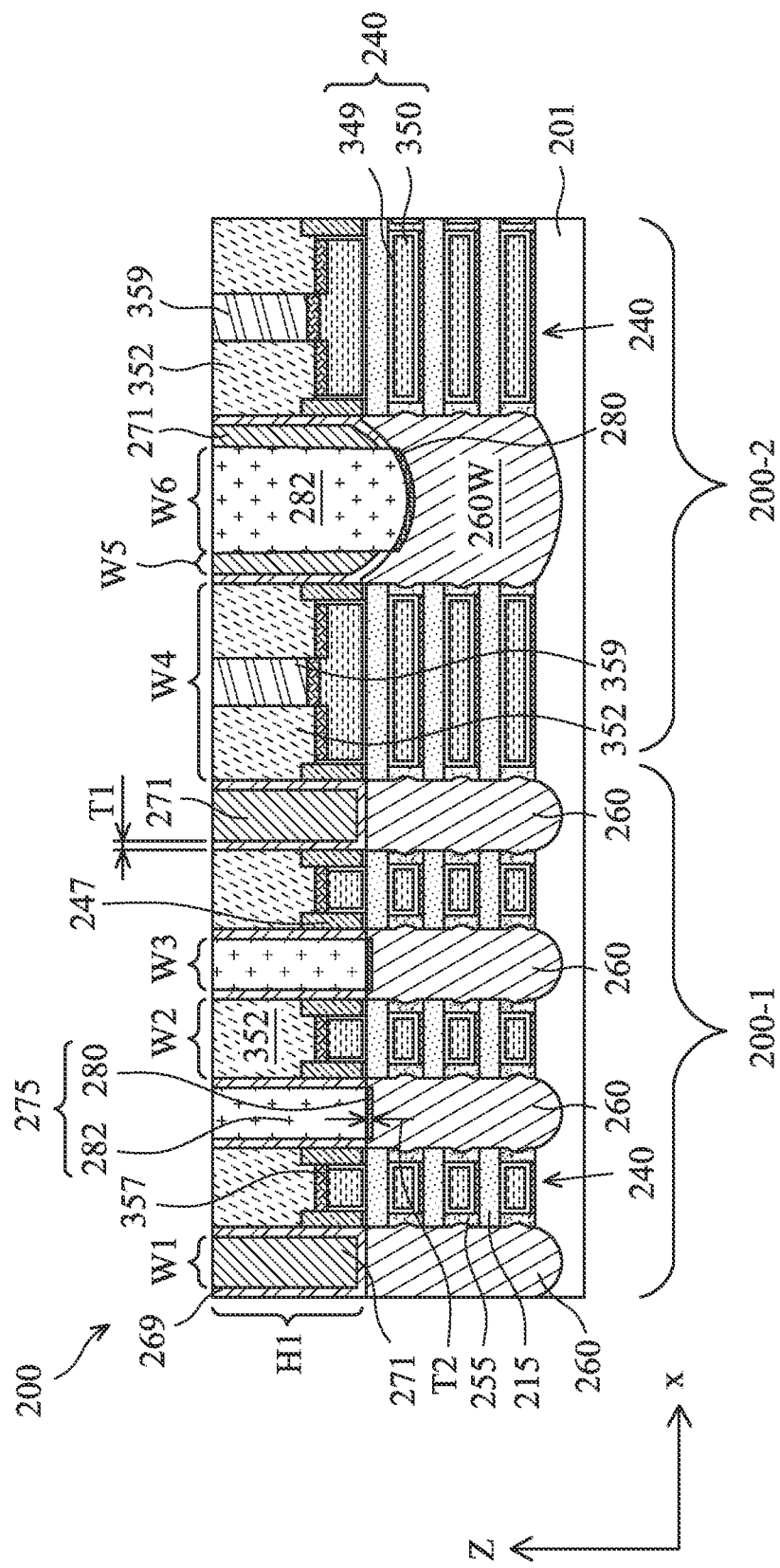
FIG. 16 is a cross-sectional view of a portion of the semiconductor device along the B-B line of FIG. 14A in accordance with an embodiment of the present disclosure.

FIG. 16 illustrates some dimensions of various features in the semiconductor device 200. For example, the metal layer 282 on the S/D electrodes 260 in the region 200-1 have a height H1 and a width W3. In an embodiment, the height H1 is in a range of about 15 nm to about 40 nm, and the width W3 is in a range of 8 nm to about 30 nm. The metal layer 282 on the S/D electrodes 260w in the region 200-2 are wider and taller than the metal layer 282 on the S/D electrodes 260 in the region 200-1. The metal layer 282 on the S/D electrodes 260w in the region 200-2 have a width W6. In an embodiment, the width W6 is in a range of about 10 nm to about 40 nm.

The dielectric fill layer 271 in the region 200-1 has a width W1. In an embodiment, the width W1 is in a range of about 8 nm to about 30 nm. The width W1 substantially equals to the width W3. Portions of the dielectric fill layer 271 are disposed laterally between the CESL 269 and the metal layer 282 in the region 200-2 and directly above the S/D electrodes 260w. Those portions of the dielectric fill layer 271 each has a width W5. In an embodiment, the width W5 is in a range of about 2 nm to about 30 nm.

The SAC layer 352 in the region 200-1 has a width W2. In an embodiment, the width W2 is in a range of about 8 nm to about 40 nm. The SAC layer 352 in the region 200-2 has a width W4 (see also W4 in FIG. 15A). In an embodiment, the width W4 is in a range of about 20 nm to about 80 nm. The width W4 is greater than the width W2. For example, a ratio of W4 to W2 may be in a range of 2 to 4 in some embodiments.

The CESL 269 has a thickness T1. In an embodiment, the thickness T1 is in a range of about 0.5 nm to about 5 nm. The silicide features 280 each has a thickness T2. In an embodiment, the thickness T2 is in a range of about 0.5 nm to about 5 nm.

FIG. 17 illustrates an alternative embodiment of the semiconductor device 200 where the trenches 272 are formed with rounded corners during the operation 16. As a result, the dielectric fill layer 271 includes portions 271' that extend directly above the CESL 269 and the SAC layer 352.

Although not intended to be limiting, one or more embodiments of the present disclosure provide many benefits to a semiconductor device and a formation process thereof. For example, embodiments of the present disclosure provide a process for forming S/D contacts in dense regions and isolated regions of a semiconductor device. The S/D contacts are formed with vertical or substantially vertical sidewalls in both regions, which advantageously increases the distance between adjacent S/D contacts and improves the semiconductor device's TDDB performance. The provided subject matter can be readily integrated into existing IC fabrication flow and can be applied to many different process nodes.

In one example aspect, the present disclosure is directed to a method that includes providing a structure having source/drain electrodes and a first dielectric layer over the source/drain electrodes and forming a first etch mask that covers a first area of the first dielectric layer. With the first etch mask in place, the method further includes performing a first etching process to the first dielectric layer, resulting in first trenches over the source/drain electrodes; filling the first trenches with a second dielectric layer that has a different material than the first dielectric layer; and removing the first etch mask. After removing the first etch mask, the method further includes performing a second etching process to the first area of the first dielectric layer, resulting in a second trench above a first one of the source/drain electrodes, wherein the second etching process includes isotropic etching; depositing a metal layer into at least the second trench; and performing a chemical mechanical planarization (CMP) process to the metal layer.

In an embodiment of the method, the removing of the first etch mask includes performing another CMP process to the second dielectric layer and the first etch mask until the first area of the first dielectric layer is exposed.

In an embodiment, after the performing of the second etching process and before the depositing of the metal layer, the method further includes depositing a second etch mask layer over the structure and filling the second trench; patterning the second etch mask layer to provide an opening; performing a third etching process to the structure through the opening, resulting in a third trench above a second one of the source/drain electrodes; and removing the second etch mask layer to regain the second trench, wherein the metal layer is deposited into both the second trench and the third trench. In a further embodiment, the third trench is wider than the second trench, and the third etching process includes anisotropic etching. In another further embodiment where the structure further includes an etch stop layer between the source/drain electrodes and the first dielectric layer, the method further includes, before the depositing of the metal layer, etching the etch stop layer to expose the first one and the second one of the source/drain electrodes.

In an embodiment of the method, the isotropic etching includes applying one or more chemicals that are more reactive with the first dielectric layer than with the second dielectric layer. In a further embodiment, the one or more chemicals include HF, $NH_3$, $NF_3$, or a combination thereof. In another further embodiment, the isotropic etching further includes using $N_2$, Ar, or a combination thereof as a carrier gas for the one or more chemicals. In another further embodiment, the isotropic etching further includes applying water vapor ($H_2O$) together with the one or more chemicals.

In another example aspect, the present disclosure is directed to a method that includes providing a structure having gate electrodes, dielectric caps over the gate electrodes, source/drain electrodes, and a first dielectric layer over the source/drain electrodes; forming a first etch mask that covers a first portion of the first dielectric layer; with the first etch mask in place, performing an anisotropic etching process to the first dielectric layer, resulting in first trenches over the source/drain electrodes; filling the first trenches with a second dielectric layer that has a different material than the first dielectric layer; performing a first chemical mechanical planarization (CMP) process to the second dielectric layer and the first etch mask until the first portion of the first dielectric layer is exposed; performing an isotropic etching process to the first portion of the first dielectric layer, resulting in a second trench above a first one of the source/drain electrodes; depositing a metal layer into the second trench; and performing a second CMP process to the metal layer.

In an embodiment of the method, the anisotropic etching process is more selective to the first dielectric layer than to the dielectric caps. In another embodiment, the first dielectric layer includes TEOS formed oxide, un-doped silicate glass, or doped silicon oxide, and the second dielectric layer includes $Si_3N_4$, SiCN, SiC, SiOC, SiOCN, $HfO_2$, $ZrO_2$, $ZrAlO_x$, $HfAlO_x$, $HfSiO_x$, $Al_2O_3$, or a combination thereof. In a further embodiment, the isotropic etching includes applying one or more chemicals that are more reactive with the first dielectric layer than with the second dielectric layer. In a further embodiment, the one or more chemicals include HF, $NH_3$, $NF_3$, or a combination thereof, wherein the isotropic etching further includes using $N_2$, Ar, or a combination thereof as carrier gas for the one or more chemicals. In another further embodiment, the isotropic etching further includes applying water vapor ($H_2O$) as an etching catalyst.

In an embodiment, after the performing of the isotropic etching process and before the depositing of the metal layer, the method further includes forming a second etch mask over the structure, wherein the second etch mask provides an opening above a second one of the source/drain electrodes; performing another anisotropic etching process to the structure through the opening, resulting in a third trench above the second one of the source/drain electrodes, wherein the third trench is narrower than the second one of the source/drain electrodes; and removing the second etch mask, wherein the metal layer is deposited into both the second trench and the third trench.

In yet another example aspect, the present disclosure is directed to a semiconductor structure that includes a semiconductor substrate; first, second, and third source/drain electrodes over the semiconductor substrate, wherein the first and the second source/drain electrodes are narrower than the third source/drain electrode; an etch stop layer, wherein first, second, and third portions of the etch stop layer are disposed over the first, the second, and the third source/drain electrodes respectively; a first source/drain contact disposed directly on the first source/drain electrode and between sidewalls of the first portion of the etch stop layer, wherein the first source/drain contact has substantially vertical sidewalls; a second source/drain contact disposed directly on the third source/drain electrode; and a dielectric layer disposed laterally between sidewalls of the second portion of the etch stop layer and laterally between the second source/drain contact and sidewalls of the third portion of the etch stop layer.

In an embodiment of the semiconductor structure, the second source/drain contact is wider than the first source/drain contact. In another embodiment, the dielectric layer includes $Si_3N_4$, SiCN, SiC, SiOC, SiOCN, $HfO_2$, $ZrO_2$, $ZrAlO_x$, $HfAlO_x$, $HfSiO_x$, $Al_2O_3$, or a combination thereof. In yet another embodiment, each of the first and the second source/drain contacts includes a silicide layer and a metal layer on the silicide layer, wherein the metal layer includes W, Ru, Co, Cu, Ti, TiN, Ta, TaN, Mo, Ni, or a combination thereof.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a semiconductor substrate;
    first, second, and third source/drain electrodes over the semiconductor substrate, wherein the first and the second source/drain electrodes are narrower than the third source/drain electrode;
    an etch stop layer, wherein first, second, and third portions of the etch stop layer are disposed over the first, the second, and the third source/drain electrodes respectively;
    a first source/drain contact disposed directly on the first source/drain electrode and between sidewalls of the first portion of the etch stop layer, wherein the first source/drain contact has vertical sidewalls;
    a second source/drain contact disposed directly on the third source/drain electrode; and
    a dielectric layer disposed laterally between sidewalls of the second portion of the etch stop layer and laterally between the second source/drain contact and sidewalls of the third portion of the etch stop layer.

2. The semiconductor structure of claim 1, wherein the second source/drain contact is wider than the first source/drain contact.

3. The semiconductor structure of claim 1, wherein the dielectric layer includes $Si_3N_4$, SiCN, SiC, SiOC, SiOCN, $HfO_2$, $ZrO_2$, $ZrAlO_x$, $HfAlO_x$, $HfSiO_x$, $Al_2O_3$, or a combination thereof.

4. The semiconductor structure of claim 1, wherein each of the first and the second source/drain contacts includes a silicide layer and a metal layer on the silicide layer, wherein the metal layer includes W, Ru, Co, Cu, Ti, TiN, Ta, TaN, Mo, Ni, or a combination thereof.

5. The semiconductor structure of claim 1, wherein the first source/drain contact is disposed between the sidewalls of the first portion of the etch stop layer along a first direction, and wherein the first source/drain contact is disposed between sidewalls of a dielectric fill layer along a second direction perpendicular to the first direction.

6. The semiconductor structure of claim 5, wherein the dielectric layer and the dielectric fill layer are composed of a same material.

7. The semiconductor structure of claim 1, wherein the first and the second source/drain electrodes are disposed in a first substrate region, and wherein the third source/drain electrode is disposed in a second substrate region different than the first substrate region.

8. The semiconductor structure of claim 7, wherein the first substrate region includes a dense region, and wherein the second substrate region includes a sparse region.

9. The semiconductor structure of claim 7, wherein a first transistor formed in the second substrate region has a larger gate length than a second transistor formed in the first substrate region.

10. The semiconductor structure of claim 1, wherein a first dielectric cap is formed over the first source/drain contact and a second dielectric cap is formed over the second source/drain contact, and wherein the second dielectric cap is wider than the first dielectric cap.

11. A semiconductor structure, comprising:
- a first source/drain epitaxial feature of a first transistor, the first transistor disposed in a first substrate region having a first transistor density;
- a second source/drain epitaxial feature of a second transistor, the second transistor disposed in a second substrate region different than the first substrate region, the second substrate region having a second transistor density different than the first transistor density;
- a first source/drain contact disposed directly on the first source/drain epitaxial feature; and
- a second source/drain contact disposed directly on the second source/drain epitaxial feature;
- wherein the first and second source/drain contacts have vertical sidewalls, and wherein the second source/drain contact is wider than the first source/drain contact.

12. The semiconductor structure of claim 11, wherein the first source/drain epitaxial feature is narrower than the second source/drain epitaxial feature.

13. The semiconductor structure of claim 11, wherein the first source/drain contact is disposed between sidewalls of an etch stop layer.

14. The semiconductor structure of claim 11, wherein the second source/drain contact is disposed between sidewalls of a dielectric fill layer, the dielectric fill layer disposed on sidewalls of an etch stop layer.

15. The semiconductor structure of claim 11, wherein the first transistor density of the first substrate region is greater than the second transistor density of the second substrate region.

16. A semiconductor structure, comprising:
- a first source/drain contact disposed in a first source/drain region and between sidewalls of a first etch stop layer;
- a first dielectric fill layer disposed in a second source/drain region and between sidewalls of a second etch stop layer; and
- a second source/drain contact disposed in a third source/drain region and between sidewalls of a second dielectric fill layer, the second dielectric fill layer disposed on sidewalls of a third etch stop layer;
- wherein the first source/drain contact and the second source/drain contact have vertical sidewalls, and wherein the second source/drain contact is wider than the first source/drain contact.

17. The semiconductor structure of claim 16, wherein a first width of the first source/drain contact is equal to a second width of the first dielectric fill layer.

18. The semiconductor structure of claim 16, wherein the first source/drain contact is disposed directly on a first source/drain epitaxial feature, wherein the second source/drain contact is disposed directly on a second source/drain epitaxial feature, and wherein the first source/drain epitaxial feature is narrower than the second source/drain epitaxial feature.

19. The semiconductor structure of claim 16, wherein a first dielectric cap is formed over the first source/drain contact and a second dielectric cap is formed over the second source/drain contact, and wherein the second dielectric cap is wider than the first dielectric cap.

20. The semiconductor structure of claim 16, wherein each of the first and the second source/drain contacts includes a silicide layer and a metal layer on the silicide layer.

* * * * *